(12) United States Patent
Yanagidaira et al.

(10) Patent No.: US 10,854,546 B2
(45) Date of Patent: Dec. 1, 2020

(54) MANUFACTURING METHOD OF A SEMICONDUCTOR DEVICE AND METHOD FOR CREATING A LAYOUT THEREOF

(71) Applicant: Toshiba Memory Corporation, Minato-ku (JP)

(72) Inventors: Kosuke Yanagidaira, Fujisawa (JP); Chikaaki Kodama, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/601,066

(22) Filed: Oct. 14, 2019

(65) Prior Publication Data

US 2020/0043845 A1  Feb. 6, 2020

Related U.S. Application Data

(63) Continuation of application No. 16/193,584, filed on Nov. 16, 2018, which is a continuation of application
(Continued)

(30) Foreign Application Priority Data

Dec. 12, 2007 (JP) .................................. 2007-320444

(51) Int. Cl.
    *H01L 23/528* (2006.01)
    *H01L 21/311* (2006.01)
    (Continued)

(52) U.S. Cl.
    CPC ...... *H01L 23/528* (2013.01); *H01L 21/31144* (2013.01); *H01L 21/76802* (2013.01);
    (Continued)

(58) Field of Classification Search
    CPC ............. H01L 27/105; H01L 27/14632; H01L 27/124; H01L 23/528; H01L 21/31144;
    (Continued)

(56) References Cited

U.S. PATENT DOCUMENTS 5,909,628 A  6/1999 Chatterjee et al.
5,946,566 A  8/1999 Choi
(Continued)

FOREIGN PATENT DOCUMENTS

JP  8-55908  2/1996
JP  2001-313294  11/2001
(Continued)

OTHER PUBLICATIONS

Japanese Office Action dated Oct. 16, 2012, issued for JP Application No. 2007-320444 (with English translation).

*Primary Examiner* — Bac H Au
(74) *Attorney, Agent, or Firm* — Oblon, McClelland, Maier & Neustadt, L.L.P.

(57) ABSTRACT

A method for manufacturing a semiconductor device of one embodiment of the present invention includes: forming an insulation layer to be processed over a substrate; forming a first sacrificial layer in a first area over the substrate, the first sacrificial layer being patterned to form in the first area a functioning wiring connected to an element; forming a second sacrificial layer in a second area over the substrate, the second sacrificial layer being patterned to form in the second area a dummy wiring; forming a third sacrificial layer at a side wall of the first sacrificial layer and forming a fourth sacrificial layer at a side wall of the second sacrificial layer, the third sacrificial layer and the fourth sacrificial layer being separated; forming a concavity by etching the insulation layer to be processed using the third
(Continued)

sacrificial layer and the fourth sacrificial layer as a mask; and filling a conductive material in the concavity.

18 Claims, 18 Drawing Sheets

Related U.S. Application Data

No. 15/719,135, filed on Sep. 28, 2017, now Pat. No. 10,163,790, which is a continuation of application No. 15/408,562, filed on Jan. 18, 2017, now Pat. No. 9,806,021, which is a continuation of application No. 14/829,250, filed on Aug. 18, 2015, now Pat. No. 9,583,437, which is a continuation of application No. 14/492,940, filed on Sep. 22, 2014, now Pat. No. 9,209,070, which is a continuation of application No. 13/665,803, filed on Oct. 31, 2012, now Pat. No. 8,865,583, which is a continuation of application No. 12/332,788, filed on Dec. 11, 2008, now Pat. No. 8,298,928.

(51) Int. Cl.

| | | |
|---|---|---|
| *H01L 21/768* | (2006.01) | |
| *H01L 23/522* | (2006.01) | |
| *H01L 27/11519* | (2017.01) | |
| *H01L 27/11526* | (2017.01) | |
| *H01L 27/11529* | (2017.01) | |
| *H01L 27/02* | (2006.01) | |
| *H01L 23/48* | (2006.01) | |

(52) U.S. Cl.
CPC .. *H01L 21/76816* (2013.01); *H01L 21/76877* (2013.01); *H01L 23/48* (2013.01); *H01L 23/522* (2013.01); *H01L 27/0207* (2013.01); *H01L 27/11519* (2013.01); *H01L 27/11526* (2013.01); *H01L 27/11529* (2013.01); *H01L 2924/0002* (2013.01)

(58) Field of Classification Search
CPC ......... H01L 21/76816; H01L 21/76877; H01L 27/0207
See application file for complete search history.

(56) References Cited

U.S. PATENT DOCUMENTS

| | | |
|---|---|---|
| 6,261,883 B1 | 7/2001 | Koubuchi et al. |
| 6,281,049 B1 | 8/2001 | Lee |
| 6,475,891 B2 | 11/2002 | Moon |
| 6,486,066 B2 | 11/2002 | Cleeves et al. |
| 7,126,227 B2 | 10/2006 | Yamaguchi |
| 7,429,536 B2 | 9/2008 | Abatchev et al. |
| 7,446,039 B2 | 11/2008 | Liu et al. |
| 8,024,689 B2 | 9/2011 | Shinomiya |
| 9,806,021 B2 | 10/2017 | Yanagidaira |
| 10,163,790 B2 | 12/2018 | Yanagidaira |
| 2005/0233564 A1 | 10/2005 | Kitada et al. |
| 2005/0281454 A1 | 12/2005 | Miyashita |
| 2006/0194429 A1 | 8/2006 | Hashimoto et al. |
| 2006/0231900 A1 | 10/2006 | Lee et al. |
| 2006/0234165 A1 | 10/2006 | Kamigaki et al. |
| 2006/0246685 A1 | 11/2006 | Saito |
| 2007/0003881 A1 | 1/2007 | Ito et al. |
| 2007/0221957 A1 | 9/2007 | Kitajima et al. |
| 2007/0285983 A1 | 12/2007 | Ishii et al. |
| 2008/0038847 A1 | 2/2008 | Young |

FOREIGN PATENT DOCUMENTS

| | | |
|---|---|---|
| JP | 2002-280388 | 9/2002 |
| JP | 2006-186104 | 7/2006 |
| JP | 2006-303022 | 11/2006 |
| JP | 2006/351861 | 12/2006 |
| JP | 2007-294783 | 11/2007 |

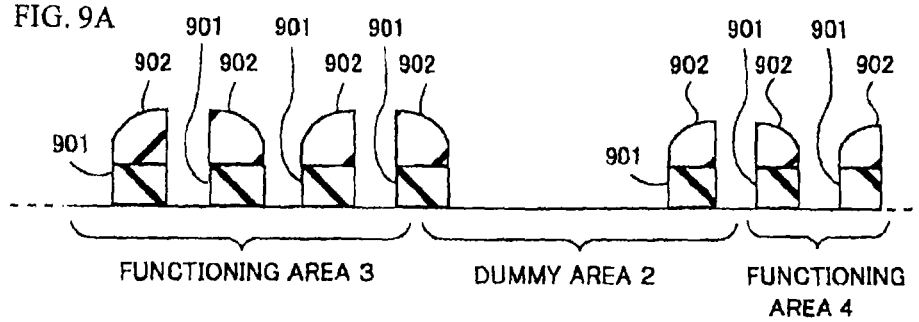
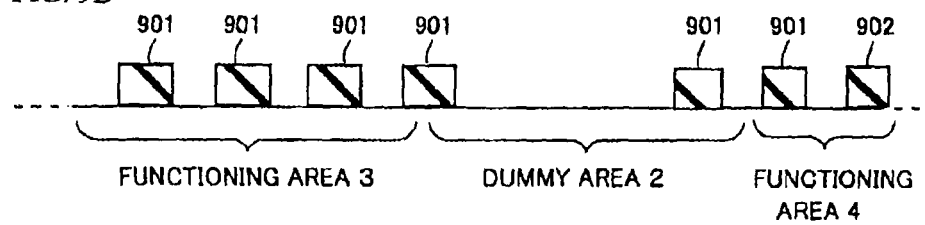
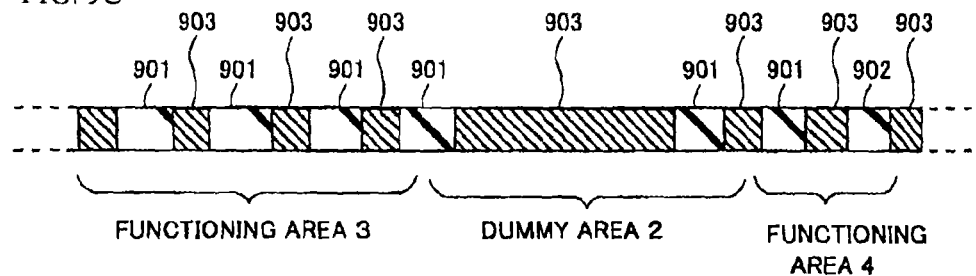
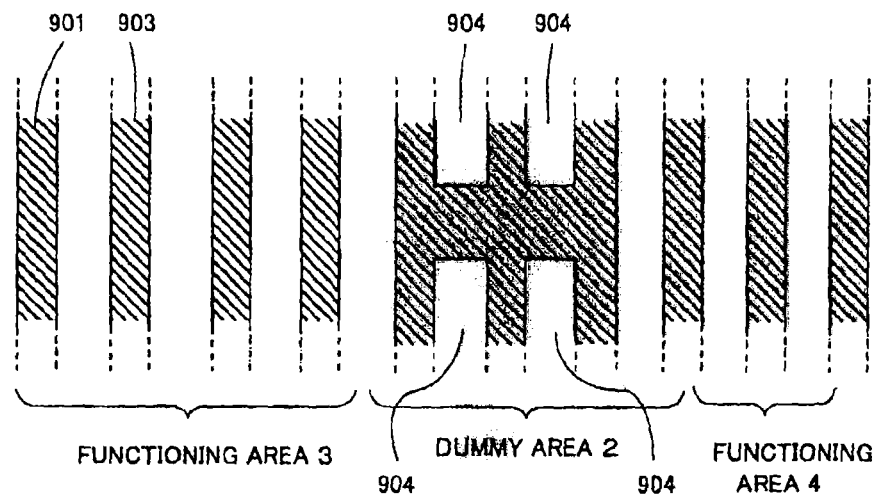

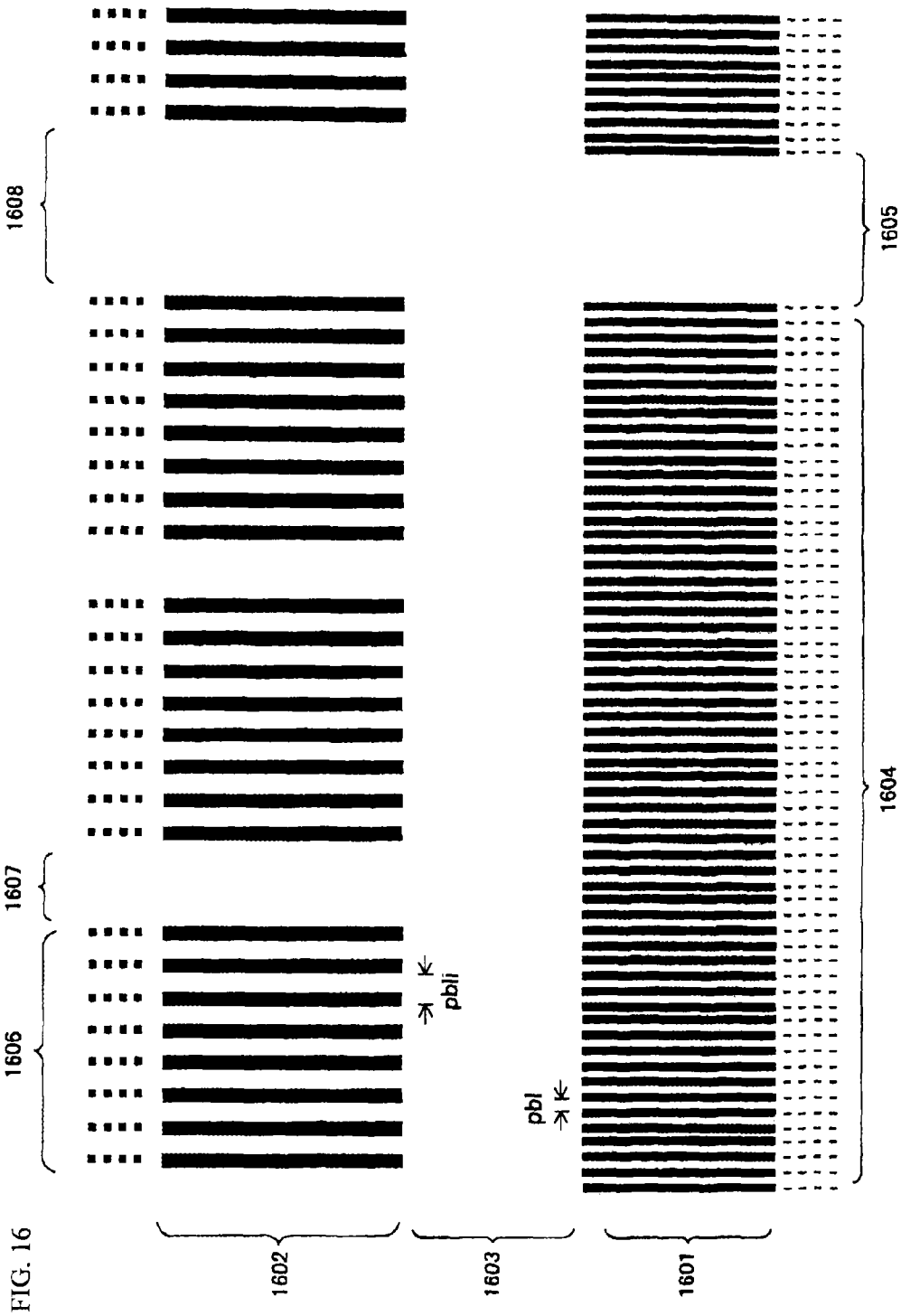

MANUFACTURING METHOD OF A SEMICONDUCTOR DEVICE AND METHOD FOR CREATING A LAYOUT THEREOF

CROSS REFERENCE TO RELATED APPLICATION

This application is a continuation of and claims the benefit of priority under 35 U.S.C. § 120 from U.S. Ser. No. 16/193,584, filed Nov. 16, 2018, which is a continuation of and claims the benefit of priority under 35 U.S.C. § 120 from U.S. Ser. No. 15/719,135, filed Sep. 28, 2017, which is a continuation of and claims the benefit of priority under 35 U.S.C. § 120 from U.S. Ser. No. 15/408,562, filed Jan. 18, 2017, which is a continuation of and claims the benefit of priority under 35 U.S.C. § 120 from U.S. Ser. No. 14/829,250, filed Aug. 18, 2015 which is a continuation of U.S. Ser. No. 14/492,940, filed Sep. 22, 2014, now U.S. Pat. No. 9,209,070, which is a continuation of U.S. Ser. No. 13/665,803, filed Oct. 31, 2012, now U.S. Pat. No. 8,865,583, which is a continuation of U.S. Ser. No. 12/332,788, filed Dec. 11, 2008, now U.S. Pat. No. 8,298,928, and claims the benefit of priority under 35 U.S.C. § 119 from Japanese Patent Application No. 2007-320444 filed Dec. 12, 2007; the entire contents of each of which are incorporated herein by reference.

BACKGROUND OF THE INVENTION

Field of the Invention

This invention is related to a method which employs side wall processing during the manufacture of a semiconductor device.

Description of the Related Art

Semiconductor devices are now widely used in a number of different fields. The demands for small scale semiconductor devices, reductions in the amount of energy consumption, improvements in reliability, and reductions in costs are increasing year by year. Particularly, in order to achieve small scale semiconductor devices an increased level of manufacturing technology is being demanded as the number of elements included in a semiconductor device per unit area is increasing.

A reduction in wiring width or a reduction in spaces between wirings is given as one method for achieving small scale semiconductor devices. However, in contemporary lithography technologies in which a pattern such as a wiring is formed using optical lithography, there are limits to the level of resolution due to the wavelength used. Thus, as a method which overcomes the limits of this resolution for forming a pattern, the side wall processing (also called side wall transfer processing) is proposed, for example, in Japan Patent Laid Open Heisei 8-55908.

The side wall processing comprises the following steps: 1) A sacrificial layer is formed on a layer to be processed; 2) The sacrificial layer is patterned by lithography, for example. The sacrificial layer may be processed by slimming; 3) at or beside the side wall of the sacrificial layer another sacrificial layer is formed as a mask; 4) using this sacrificial layer as a mask the layer to be processed is etched. By the side wall processing, it is possible to form a detailed pattern which exceeds the resolution limits of lithography when the side wall processing is used.

However, in the side wall processing there are constraints to the shape of a pattern which is formed by a sacrificial layer used as a mask. As a result, the pattern which can be obtained by etching a layer to be processed includes unnecessary wiring patterns and short circuits are sometimes generated via these unnecessary wirings. In addition, when a pattern density formed by a sacrificial layer which becomes a mask changes significantly depending on the positions, the microloading effect sometimes occurs. This is because the speed of etching the layer to be processed changes depending on the positions. Also, the dishing effect sometimes occurs during a CMP (Chemical Mechanical Polishing) process in a damascene process which is performed after the layer to be processed is etched. As a result, it becomes difficult to improve the yield.

BRIEF SUMMARY OF THE INVENTION

A method for manufacturing a semiconductor device according to one embodiment of the present invention comprises: forming an insulation layer to be processed over a substrate; forming a first sacrificial layer in a first area over the substrate, the first sacrificial layer being patterned to form in the first area a functioning wiring connected to an element; forming a second sacrificial layer in a second area over the substrate, the second sacrificial layer being patterned to form in the second area a dummy wiring; forming a third sacrificial layer at a side wall of the first sacrificial layer and forming a fourth sacrificial layer at a side wall of the second sacrificial layer, the third sacrificial layer and the fourth sacrificial layer being separated; forming a concavity by etching the insulation layer to be processed using the third sacrificial layer and the fourth sacrificial layer as a mask; and filling a conductive material in the concavity.

A method for manufacturing a semiconductor device according to one embodiment of the present invention comprises: forming a conducting layer to be processed over a substrate; forming a first sacrificial layer in a first area over the substrate, the first sacrificial layer being patterned to form in the first area a functioning wiring connected to an element arranged over the substrate; forming a second sacrificial layer in a second area over the substrate, the second sacrificial layer being patterned to form in the second area a dummy wiring; forming a third sacrificial layer at a side wall of the first sacrificial layer and forming a fourth sacrificial layer at a side wall of the second sacrificial layer, the fourth sacrificial layer being comprised of a plurality of connected components; forming a concavity by etching the conducting layer to be processed using the third sacrificial layer and the fourth sacrificial layer as a mask; and filling an insulating material in the concavity.

A method for creating a layout of a semiconductor device according to one embodiment of the present invention comprises: deciding wiring pathways connecting a plurality of elements arranged within an integrated circuit of the semiconductor device; synthesizing layout data for creating a mask pattern for processing a insulating layer over a substrate to realize the wirings based on the wiring pathways; calculating a change of density of the mask pattern based on the layout data; arranging a patter of a dummy wiring in the mask pattern to lessen the change of density.

BRIEF DESCRIPTION OF THE DRAWINGS

FIGS. 9A-9D are diagrams which explain the occurrence of short circuits due to unnecessary wirings generated during side wall processing.

FIG. 16 is a diagram which shows functioning wirings of a memory cell array and sense amplifier related to a nonvolatile semiconductor memory device related to one embodiment of the present invention.

DETAILED DESCRIPTION OF THE PREFERRED EMBODIMENTS

Below, the preferred embodiments of the present invention are described. Furthermore, the present invention should not be interpreted as limited to the embodiments described below. It is possible to work the present invention by various embodiments.

First Embodiment

Figure 1A:
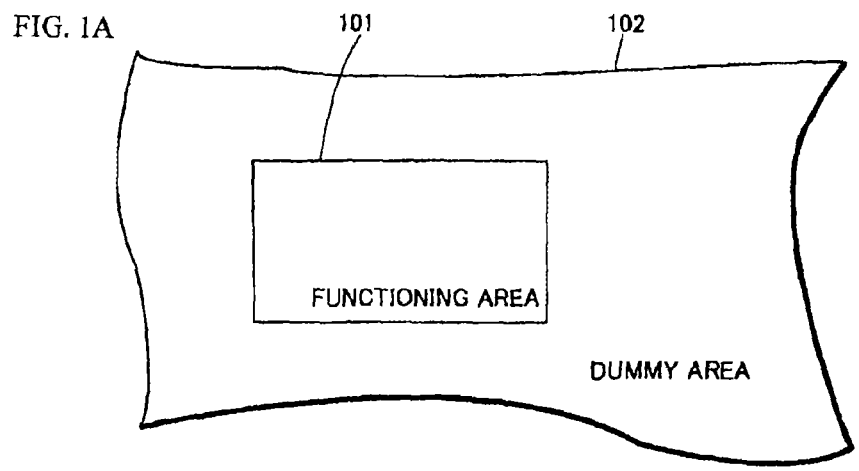
FIGS. 1A-1C are exemplary planar views of a part of a substrate of a semiconductor device relating to one embodiment of the present invention.

FIG. 1 exemplarily shows a plane view of a part of a substrate of a semiconductor device related to one embodiment of the present invention. As is shown in FIG. 1(A), the semiconductor device related to one embodiment of the present invention includes, on the substrate, a functioning area 101 and a region called a dummy area 102. A functioning area is a region on a substrate in which a plurality of elements required for exercising the functions of a semiconductor device (such elements are hereinafter referred to as functioning elements) and wirings which connect the functioning elements (such wirings are hereinafter referred to as functioning wirings) are arranged. A functioning wiring and a functioning area can be inductively defined as follows. First, an input/output terminal which inputs and/or outputs signals from and/or to exterior devices is a functioning element. And a wiring which is connected to a functioning element is a functioning wiring. An element which is connected to a functioning wiring is a functioning element. Furthermore, when a functioning element is a switching element such as a transistor and this element is always in an OFF state, a wiring which is connected via this functioning element may be further defined to be not a functioning wiring.

Further, a functioning area and a dummy area are not limited to be located on the surface of the substrate but also located in the interior of the substrate, above the surface of a layer which is arranged in a position of a certain distance from the surface of the substrate. That is, a functioning area and a dummy area are formed in a single layer or a plurality of layers above, on, or beneath the substrate.

A dummy area is defined to be a region excluding functioning areas. That is, the region in which wirings which do not contribute to the operations of circuits formed using the above stated functioning elements and functioning wirings, are arranged. In other words, a dummy area is a region in which wirings not connected to functioning elements and functioning wirings which is unrelated to the operations of the semiconductor device, are arranged (such wirings are hereinafter referred to as dummy wirings) or a region in which insulation material is arranged between the functioning wirings and the dummy area.

Figure 1B:
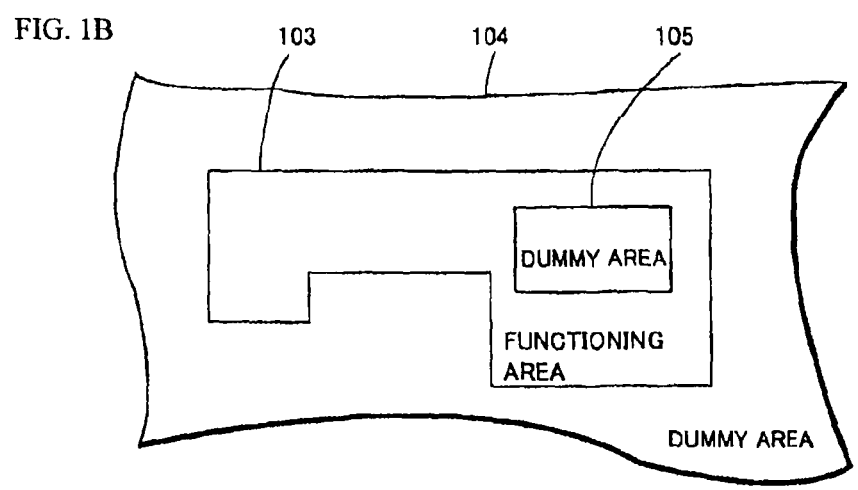
Figure 1C:
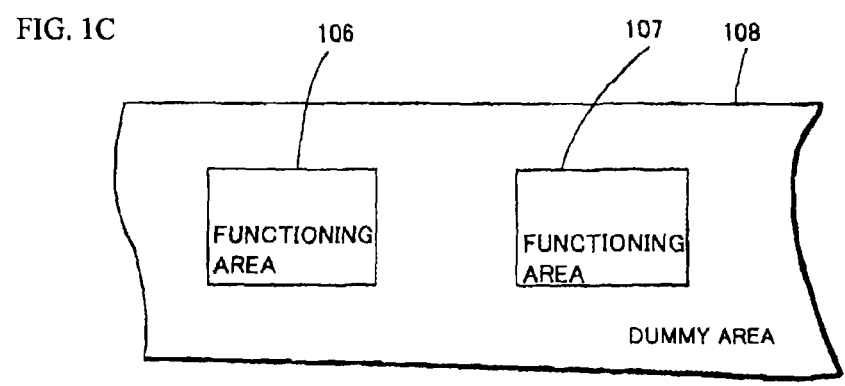

FIGS. 1(B) and (C) exemplify a functioning area and a dummy area from another viewpoint. As is shown in FIG. 1(B), the functioning area 103 which is surrounded by the dummy area 104 does not have to be a convex shaped region but may also include a concave section. Also, there may also be a dummy area 105 within the functioning area 103. In addition, as is shown in FIG. 1(C), there may be a plurality of functioning areas 106 and 107 which is surrounded by a dummy area 108.

Figure 2A:
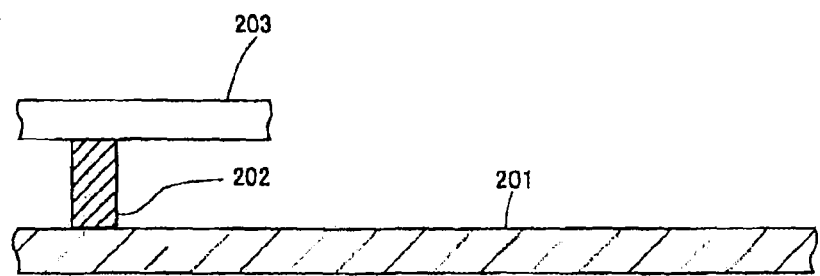
FIGS. 2A-2C are diagrams which explain a functioning wiring and a functioning area in a semiconductor device relating to one embodiment of the present invention.
Figure 2B:
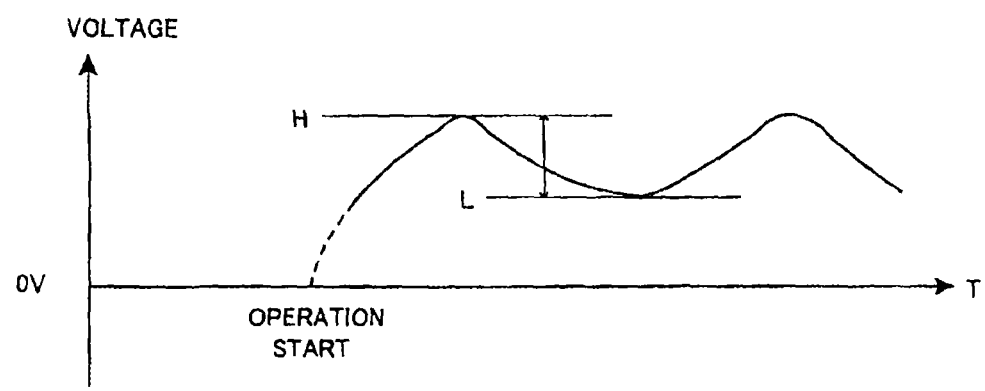
Figure 2C:
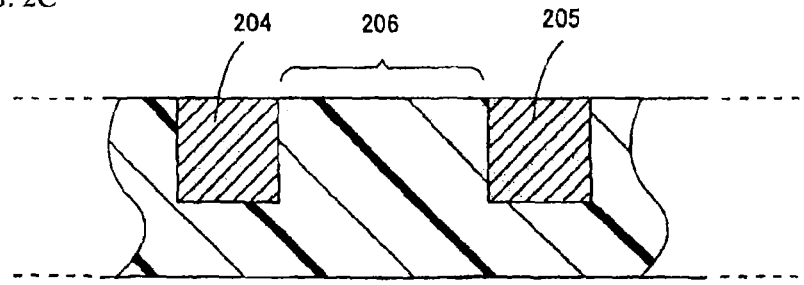

FIG. 2 is a diagram which explains the functioning wirings and functioning area from a number of viewpoints. In FIG. 2(A), assuming that the wiring of the reference number 201 connects together elements which are necessary for the functions of the semiconductor device, the functioning wiring 203 which is connected to the functioning wiring 201 via a contact 202 is then shown as a functioning wiring. In addition, FIG. 2(B) is a diagram which explains a functioning wiring from the viewpoint of a variation in a voltage which is applied. That is, following the point where operations of the semiconductor device begin, for example, after a certain period of time has elapsed since a power supply, a wiring in which a variation in a voltage which is applied exceeds a certain value, is a functioning wiring. The variation in voltage is defined as the difference between the maximum voltage H and the minimum voltage L after the point in time when operations begin. For example, the variation in voltage is required as the arithmetic difference between H and L or as a ratio of the size of H to the size of L (furthermore, when a ratio is calculated, a standard/base voltage is appropriately changed in the case where L becomes 0). In addition, in FIG. 2 (C), when the symbols 204 and 205 are referring to functioning wirings, an insulation region 206 (space between the functioning wirings 204 and 205) which is located between these functioning wirings forms a functioning area. Of course, the functioning wirings 204 and 205 which form a functioning area is also shown.

In the description above, a functioning area is defined first and then a region which is not a functioning area is defined as a dummy area. However, the definitions of the functioning area and dummy are not limited to the definitions stated above. Reversely, a dummy area can also be defined first. That is, a wiring which is not connected to a contact hole or even if a wiring is connected to a contact hole, a dummy wiring is defined as a wiring with a fixed voltage which is applied at operation time of a semiconductor device or a wiring with a voltage variation within a predetermined level. Then, a dummy area can be defined as a region which includes a dummy wiring and insulation material which is in contact with a dummy wiring, and a functioning area can be defined as a region excluding a dummy area.

In semiconductor devices, particularly in semiconductor memory devices which include memory circuits, the same pattern of a detailed structure for achieving small size repeatedly appears in a functioning area. However, because a dummy area is not related to a functioning of the semiconductor device, in a dummy area either there are no wirings at all or there are few wirings compared to a functioning area. Therefore, when the number of wirings which are crossed by a line segment of a certain length (such number is generally defined as an inverse of a pitch) or the ratio of area occupied by elements and wirings in a certain area (such ration is generally defined as a patter density) is calculated, generally the inverse of a pitch or the pattern density in a dummy area becomes smaller than the inverse of a pitch or the pattern density in a functioning area.

Figure 3:
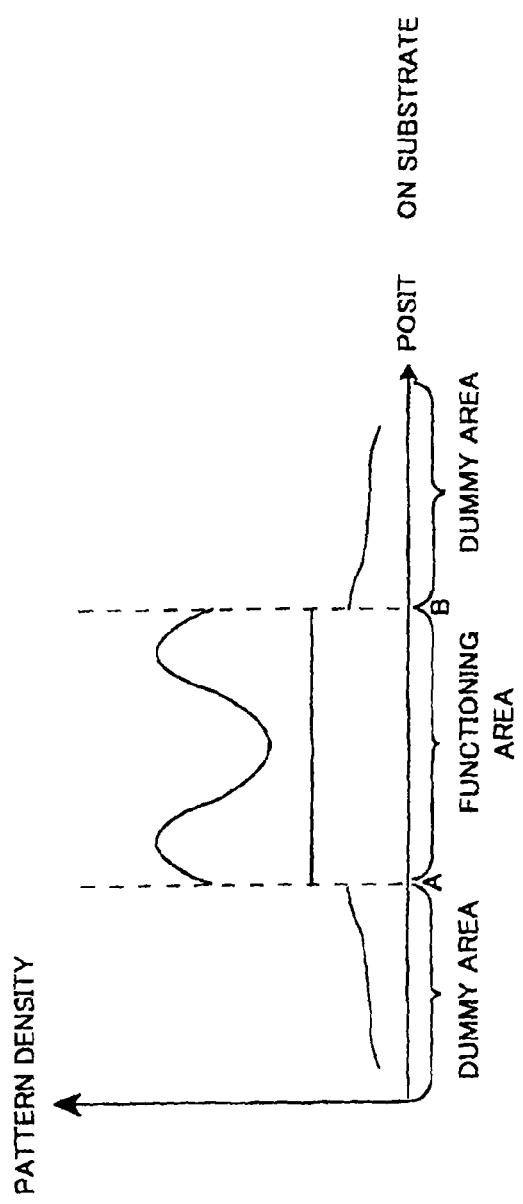
FIG. 3 is an exemplary diagram for explaining a pattern density in a functioning area and a dummy area.

Therefore, a graph of a change in a pattern density to a position on a substrate is drawn as in FIG. 3, for example. That is, the pattern density is different between the dummy area and the functioning area. The pattern density of the functioning area is larger than the pattern density in the dummy area. Also, as in a memory cell array of a nonvolatile semiconductor memory device, when the same pattern is regularly and repeatedly arranged, a periodically changing graph of a change in a pattern density in the interior of a functioning area is obtained. In addition, when a functioning area and a dummy area are regularly and repeatedly arranged, a periodically changing graph of the position in which this type of functioning and dummy area are arranged is obtained.

In addition, a spatial frequency of a pattern can be calculated for each position on a substrate. For example, (1) an image of a pattern, which is formed by wirings and insulation spaces formed in/on a substrate, is decomposed into square pixels having a side length of a half of a minimum process dimension according to Shannon's Theorem for example, (2) the adjacent pixels are grouped into square blocks of pixels, (3) the discrete Fourier transformation or discrete cosine transformation is applied to each groups.

As to the spatial frequency as calculated above, when the same pattern of a functioning area and a dummy area is regularly and repeatedly arranged, the spatial frequency regularly changes. In addition, when the same pattern is repeated in the interior of a functioning area the spatial frequency periodically changes spatially.

The value of the inverse of a pitch is sometimes different depending on the direction of a line segment of certain length for calculating a number of wirings crossing a line of a length of a predetermined length, and there is a problem in calculating mechanically and accurately the pitch. While by calculating a patter density, a problem such as in calculating a pitch does not occur because a pattern density is calculated as a value of one dimension for a region of a certain area, there is a problem in which it is difficult to know the direction of wirings for example. This problem is overcome by calculating a spatial frequency because a spatial frequency can be calculated mechanically as a two dimensional value to a block which expands in two dimensions.

When a pattern density or a spatial frequency in a functioning area and dummy area are significantly changes, the possibility of dishing effects during a planarization process such as CMP or the possibility of microloading effects due to a difference in etching speed within a substrate becomes greater.

Figure 18:
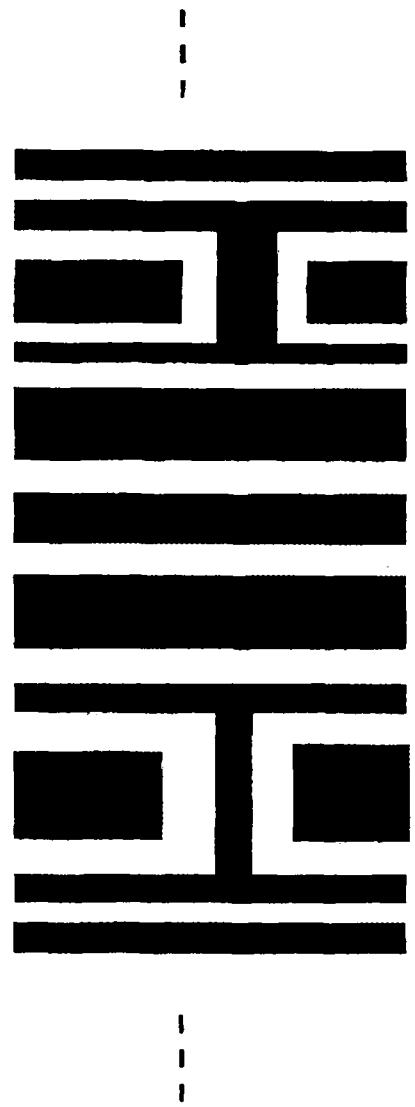
FIG. 18 is a diagram which shows microloading effects.

FIG. 18 explains the occurrence of microloading effects. In FIG. 18, a mask is arranged in the white sections and the state after an anisotropic etching in a perpendicular direction of the diagram to the black parts. Even if an anisotropic etching is performed in a perpendicular direction, it is inevitable that an etching in horizontal direction is slightly performed. As a result, even if a mask of the same width is arranged on the white sections, when a pattern density of a mask pattern or a spatial frequency is different depending on positions on the substrate, the speed of etching in a horizontal direction is different. FIG. 18 shows a result where the speed of etching in a horizontal direction is different. Specifically, when a pattern density or a spatial frequency is in a high position, the speed of etching in a horizontal direction becomes greater compared to a low position. As a result, the higher the position of a pattern density or a spatial frequency is, the larger the amount of erosion of the part beneath a mask and the width of the white part becomes smaller. In FIG. 18, because the pattern density or the spatial frequency in an end part from the central part is high, the width of the white part of the end part becomes smaller.

Of course, depending on the etching conditions, mask material, or material to be etched, it is sometimes the case that the lower the pattern density or spatial frequency is, the larger the speed of etching.

When microloading effects or dishing effects occur, the manufacturing yield of semiconductor devices decreases. Thus a semiconductor device related to one embodiment of the present invention is manufactured so that changes in a pattern density and/or a spatial frequency under side wall processing, which accompany the restrictions in pattern formation, become smaller or equal. While in addition, the occurrence of short circuits becomes greater under side wall processing because unnecessary wirings are generated, in the manufacturing method of a semiconductor device related to one embodiment of the present invention, this problem is solved.

Below, an outline of a side wall processing is explained while referring to FIG. 4 to FIG. 6. Next, the phenomenon whereby short circuits occur easily when the changes in pattern density or spatial frequency in a side wall processing are made smaller is explained while referring to FIG. 7 and FIG. 8.

Figure 4A:
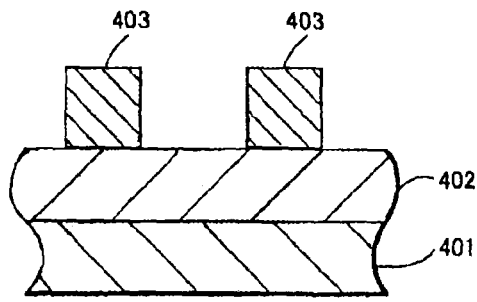
FIGS. 4A-4F are diagrams which explain an outline of side wall processing.
Figure 4B:
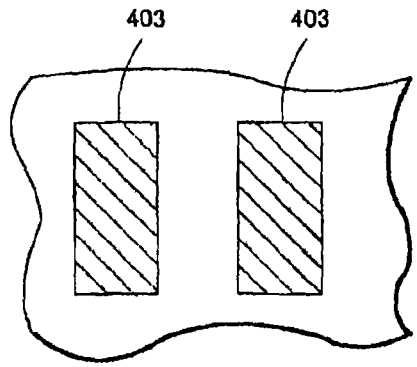

FIG. 4(A) shows a cross section of a substrate and a structure which is formed on the substrate. A layer 402 to be processed is deposited on a substrate 401, a first sacrificial layer 403 is further deposited on the layer 402 to be processed and the first sacrificial layer 403 is formed into a certain pattern by lithography. FIG. 4(B) shows a planar view of the substrate 401.

Furthermore, there are cases where the layer to be processed is a conductive layer having conductive properties and where an insulation layer having insulation properties. Polysilicon, for example, may be used as a material for a conductive layer and silicon oxide may be used as a material for an insulation layer.

Figure 4C:
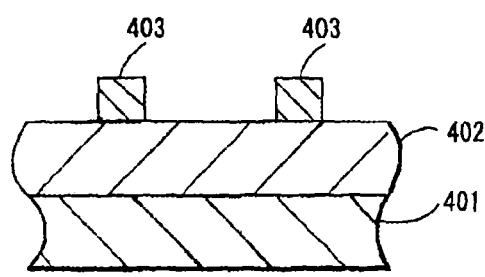
Figure 4D:
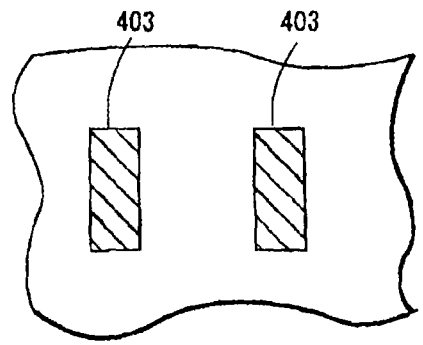

FIGS. 4(C) and (D) show a structure after a slimming process has been performed on the first sacrificial layer 403 to make a finer pattern of the first sacrificial layer 403. Furthermore, slimming is not an essential process and can be performed according to necessity.

Figure 4E:
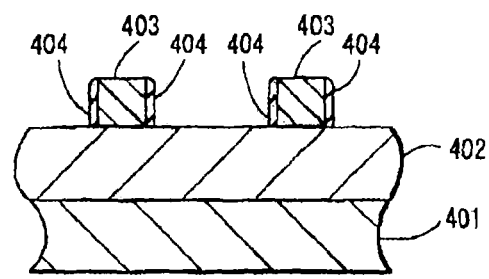
Figure 4F:
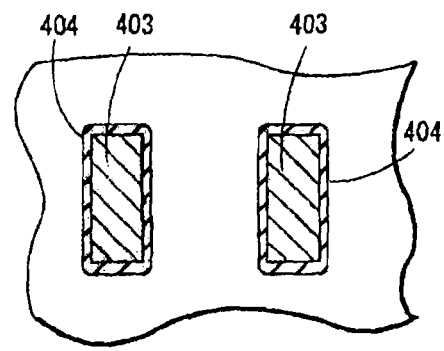

Next, the material of the second sacrificial layer 404 has been deposited on the layer 402 to be processed on which the pattern by the first sacrificial layer 403 is formed. FIGS. 4(E) and (F) show a structure after anisotropic etching has been performed so that a second sacrificial layer 404 is left at or beside the side wall of the first sacrificial layer 403. Because the second sacrificial layer 404 is formed at or beside the side wall of the first sacrificial layer 403, the shape of the second sacrificial layer 404 becomes a loop shape as is shown in FIG. 4(F). The second sacrificial layer surrounds the pattern formed by the first sacrificial layer 403.

Figure 5A:
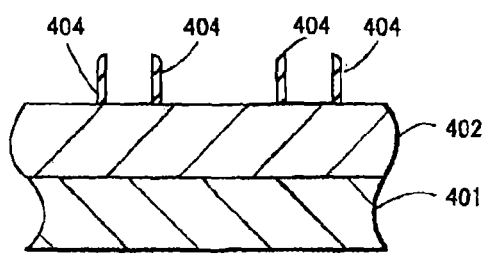
FIGS. 5A-5F are diagrams which explain an outline of side wall processing.
Figure 5B:
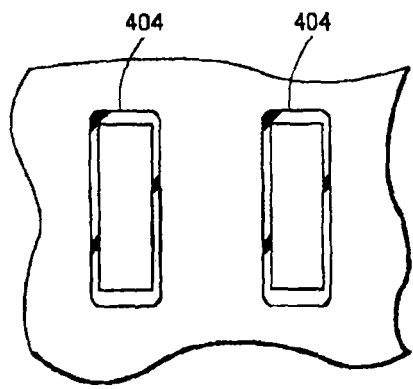
Figure 5C:
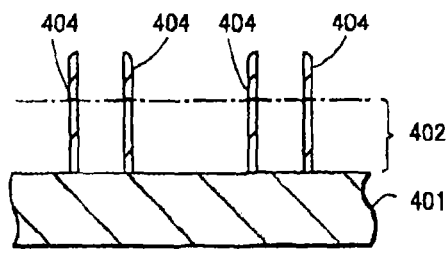
Figure 5D:
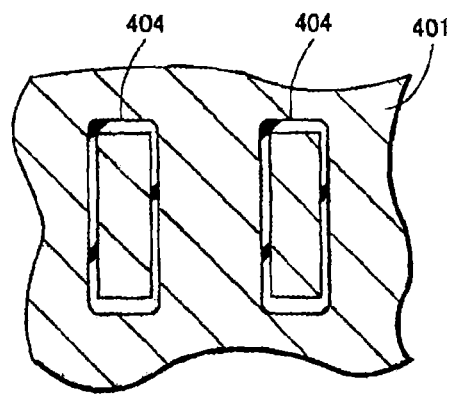
Figure 5E:
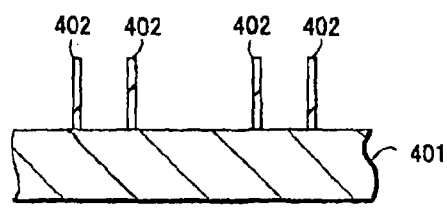
Figure 5F:
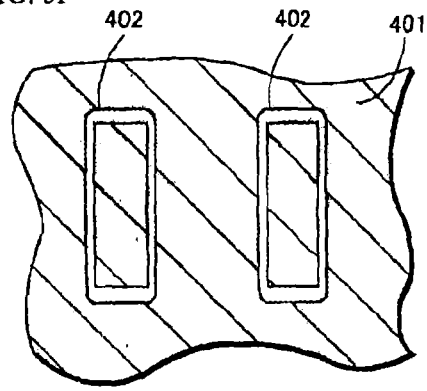

FIGS. 5(A) and (B) show a structure after the first sacrificial layer 403 has been selectively removed. Then, FIGS. 5(C) and (D) show a structure when the layer 402 to be processed is etched using the second sacrificial layer 404 as a mask. A concavity is formed in the layer 402 except under the second sacrificial layer 404. After this the second sacrificial layer 404 is selectively removed and the structure shown in FIGS. 5(E) and (F) are obtained.

Figure 6A:
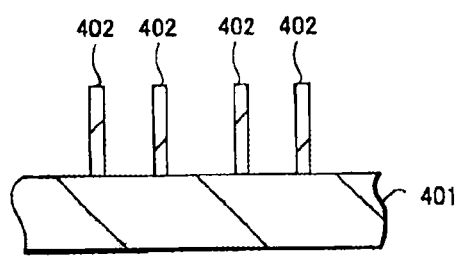
FIGS. 6A-6F are diagrams which explain an outline of side wall processing.
Figure 6B:
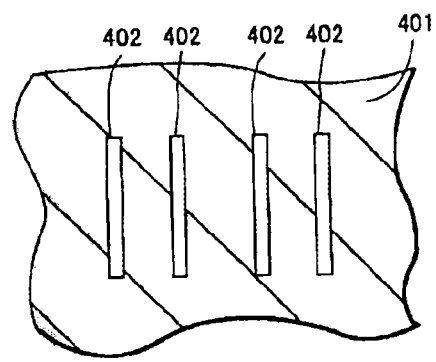
Figure 6C:
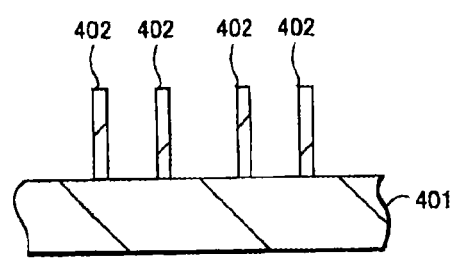
Figure 6D:
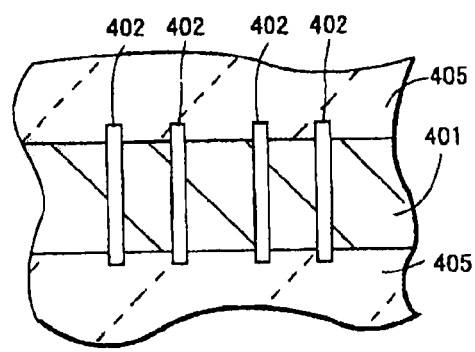

As stated above, because the second sacrificial layer 404 has a loop shape the concavity pattern formed by the etching layer 404 using the second sacrificial layer 404 as a mask also has a loop structure. Therefore, a part of the loop structure generally is removed in order to form one or more wirings. In addition, there are cases when there is a need for a process to restrict the range in which a different material is filled between the second sacrificial layer 404, which is left by etching. Then, as is shown in FIGS. 6(A) and (B), for example, in order to restrict the range in which a different material is filled after obtaining the structure in which a part of the layer 402 to be processed is removed, another material 405 is filled as in shown in FIGS. 6(C) and (D), for example. Furthermore, another material 405 can be the same material as the layer 402 to be processed. That is, another material 405 may be a different material to the material which is filled in the concavity formed between the layer 402 to be processed.

Figure 6E:
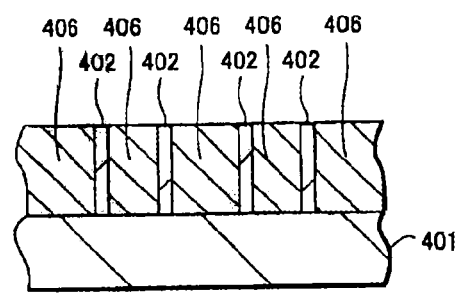
Figure 6F:
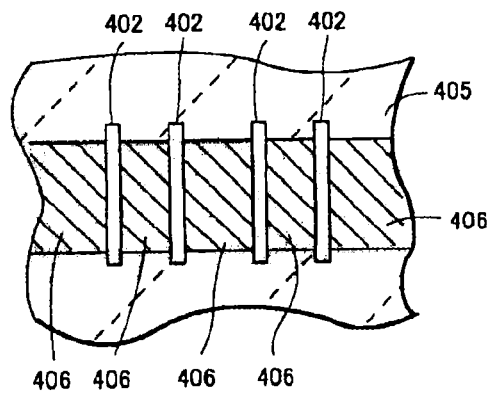

Then, another material 406 is filled between the layers 402 to be processed as shown in FIGS. 6(E) and (F). That is, a structure in which the material 406 is sectioned by the layer 402 to be processed can be obtained. A width which is sectioned by the material 404, that is, the width of a line of a pattern formed on the layer 402 to be processed can be made smaller than the resolution limits of lithography by side wall processing. In addition, when slimming is performed on the first sacrificial layer 403, the width of the material 406, that is, the distance between the layers 402 to be processed 402, can be made smaller than the resolution limits of lithography.

Furthermore, the process for removing a part of a loop, the process for further depositing another material 405 and the process for depositing yet another material 406 can be appropriately interchanged. For example, the material 406 may be deposited in the structure in FIGS. 5(E) and (F) and then a region in which another material 406 is deposited in FIGS. 6(C) and (D) is etched and a part of the loop is removed.

Figure 7A:
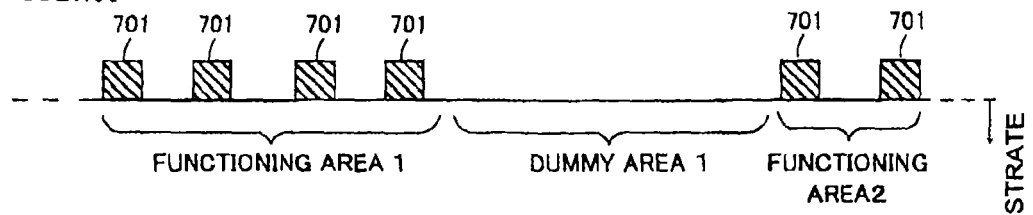
FIGS. 7A-7D are diagrams which explain the occurrence of short circuits due to unnecessary wirings generated during side wall processing.

FIG. 7(A) shows a functioning area 1 and a functioning area 2 on the substrate with a dummy area 1 which exists between these functioning areas. Furthermore, the functioning area 1 and the functioning area 2 may be a part of the same functioning area.

In FIG. 7(A), because there are no wirings in the dummy area 1 the pattern density and/or the spatial frequency in the functioning area 1 and functioning area 2 and the pattern density and/or the spatial frequency in the dummy area 1 are significantly different. As a result, microloading effects and/or dishing effects occur as stated above.

Figure 7B:
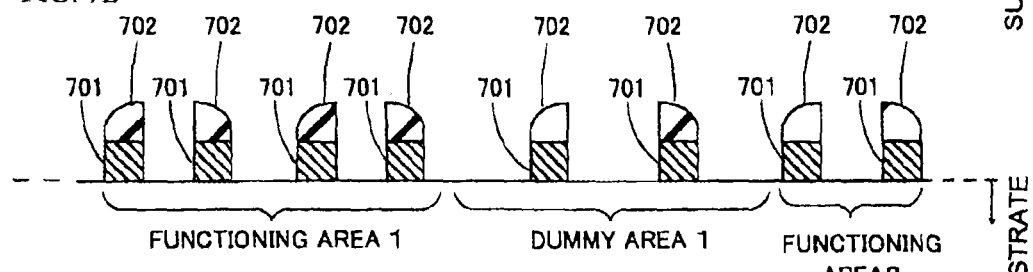

Thus, the conducting material which becomes a wiring 701 is deposited on the substrate in the shape of a layer, the second sacrificial layer 702 is added to the functioning area 1 and functioning area 2 and also formed on the dummy area 1 and etched as is shown in FIG. 7(B) making the differences of spatial frequency etc. smaller.

Because of the constraints due to side wall processing, as is shown in FIG. 7(B) the number of dummy wirings that are formed on the dummy area 1 becomes an even number. In addition, when the second sacrificial layer is extended only in one direction, the force received in the vertical direction makes it easy for the shape of the second sacrificial layer to break up. As a result, a decrease in yield occurs due to the formation of unnecessary wirings in the dummy area 1. Thus, utilizing the fact that the number of dummy wirings is an even number, adjacent second sacrificial layers which are formed in the dummy area 1 are connected in a ladder shape and the structure shown as a planar view in FIG. 7(C) is obtained.

Figure 7C:
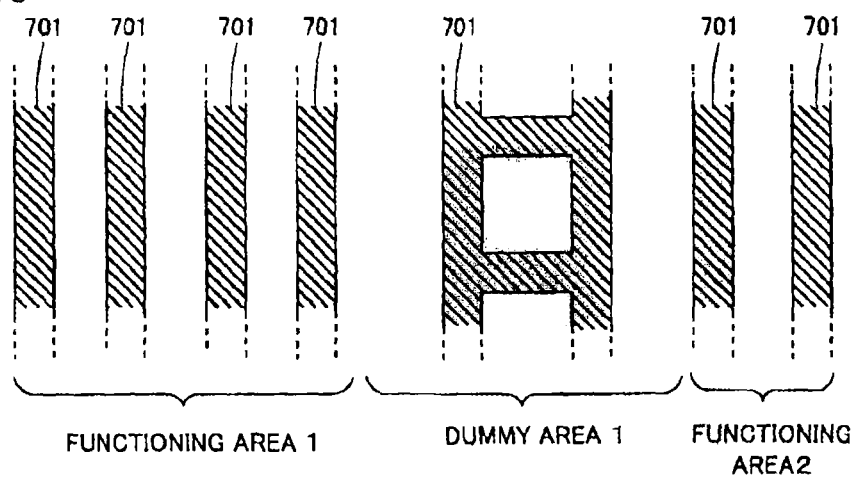
Figure 7D:
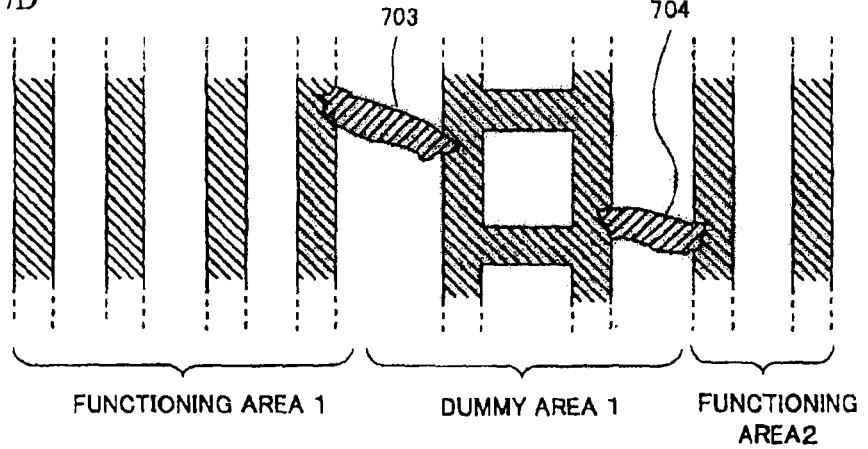

However, in the structure shown in FIG. 7(C), when dust 703 and dust 704 which have conductive properties are attached as shown in FIG. 7(D), a wiring in the functioning area 1 and another wiring in the functioning area 2 short out.

A method for detecting whether this type of short circuit occurs is considered. For this consideration, a region which becomes equipotential by a wiring is described as a node. In addition, in order to distinguish between a wiring within a functioning area and a wiring within a dummy area, a node which describes a wiring in a functioning area is for example colored black and a node which describes a wiring in a dummy area is colored white. In addition, an insulation space between two wirings can be described as an edge which connects a node which describes these two wirings. Then, a graph structure can be obtained which corresponds to a wiring pattern. The graph shown in this graph structure is hereinafter called a pattern graph.

Figure 8A:
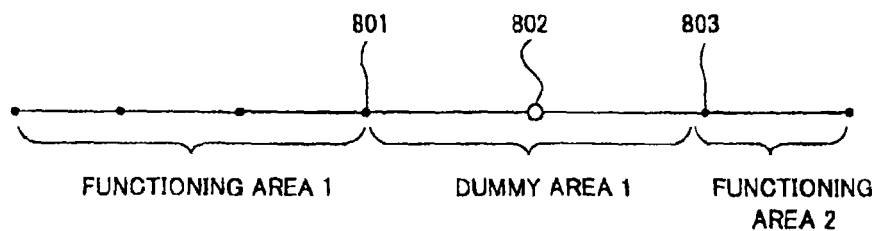
FIGS. 8A-8C are diagrams which explain the occurrence of short circuits due to unnecessary wirings generated during side wall processing.

A pattern graph corresponding to the pattern shown in FIG. 7(C) is shown in FIG. 8(A). The subgraph on the left of the node 801 is a pattern graph corresponding to the functioning area 1, the subgraph on the right of the node 803 is a pattern graph corresponding to the functioning area 2 and the subgraph constructed by the node 802 and the edges connected to the node 802 is a pattern graph corresponding to the dummy area 1.

Figure 8B:
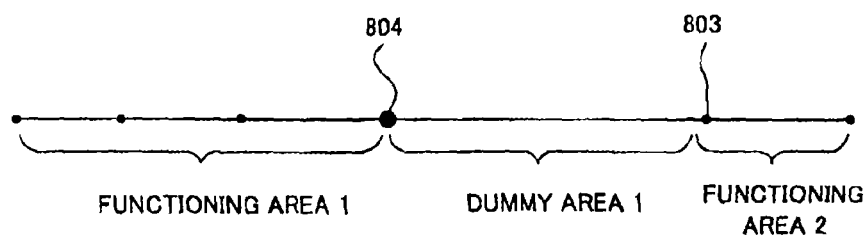

First, assuming that the dust 703 is attached, the rightmost wiring in the functioning area 1 and the wiring in the dummy area 1 get connected electrically. This situation is equivalent to a fusing together of the node 804 and the node 803 in the pattern graph and a new node 804 is produced as is shown in FIG. 8(B).

Figure 8C:
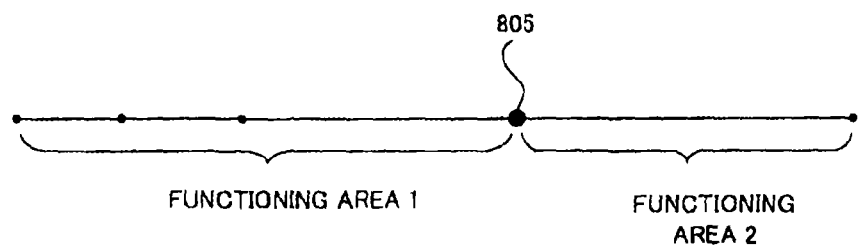

Next, assuming that the dust 704 is attached, the wiring in the dummy area 1 and the leftmost wiring in the functioning area 2 get connected electrically. In this situation, the node 804 and the node 803 fuse together in the pattern graph and a new node 805 is produced as shown in FIG. 8(C). Then, the dummy area 1 disappears from the pattern graph.

Even if the dust 704 is attached before the dust 703, similarly the pattern graph shown in FIG. 8(C) is obtained.

Therefore, in the case where different black nodes F1 and F2 are connected via two edges to a white node D, D and F1 fuse together, and when the fused node and F2 fuse together the dummy area equivalent to D disappears and a short circuit occurs in the functioning area corresponding to F1 and F2.

Therefore, in the pattern graph, when a plurality of edges are connected to a white node, if a pattern is formed so that the number of edges among the plurality of edges which are connected to a black node is at most one, a short circuit occurring via a wiring of a dummy area corresponding to this white node can be suppressed.

That is, the shape of the second sacrificial layer which is formed in a dummy area does not become one geometrically connected component and may be comprised of a plurality of connected components. This is because if the shape of the second sacrificial layer which is formed in a dummy area becomes one connected component, because the shape of a conducting material in the dummy area is expressed as one connected component, that is, one white node, two black nodes are connected to this node and when the fusing together of nodes stated above occurs twice, the subgraph of the dummy area disappears.

FIG. 9, unlike FIG. 7, is a diagram which explains the dangers of a short occurring due to dust being attached during a process to obtain a wiring pattern by making an insulation layer into a layer to be processed, forming the second sacrificial layer on the insulation layer and performing damascene processing. As is shown in FIG. 9(A), it is assumed that the dummy area 2 exists between the functioning area 3 and the functioning area 4. In order to arrange wirings in the functioning area 3 and the functioning area 4, a plurality of second sacrificial layers 902 is formed above the insulation layer 901 within the functioning area 3 and the functioning area 4 and it is sufficient to form a second sacrificial layer 902 in the periphery of the dummy area 2.

Then, the insulation layer 901 is etched using the second sacrificial layer 902 as a mask and as is shown in FIG. 9(B), the second sacrificial layer 902 is selectively etched and as is shown in FIG. 9(C), and a conducting material 903 is filled into the insulation film 901 by a damascene process.

However, in this state, a large difference of the spatial frequency of pattern and/or the density of pattern is produced between the functioning areas 3 and 4 and the dummy area 2. Therefore, as is shown in the upper surface diagram in FIG. 9(D), a space 904 is arranged within the dummy area 2 and the difference in the spatial frequency becomes smaller or disappears. Even in this case, a pattern is arranged so that a pair of the spaces 904 is created. However, when a pattern graph is created for the pattern shown in FIG. 9(D), the pattern graph becomes the same as the pattern graph shown in FIG. 8 and the fact that it becomes easier for short circuits to occur is detected.

Figure 10A:
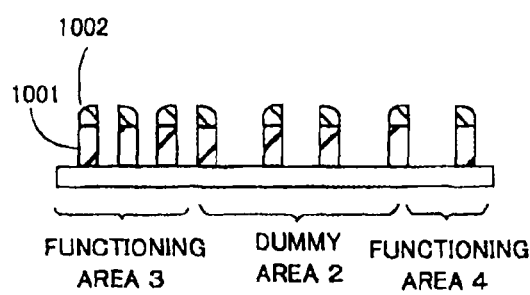
FIGS. 10A-10E are diagrams which explain a pattern in which short circuits do not occur easily even when unnecessary wirings are generated due to side wall processing.
Figure 10B:
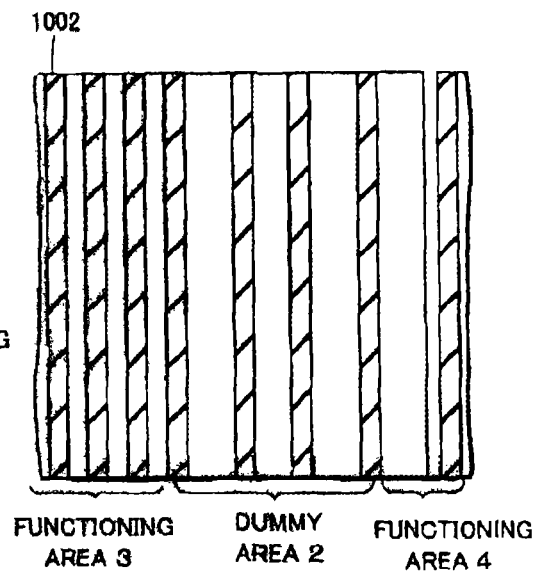
Figure 10C:
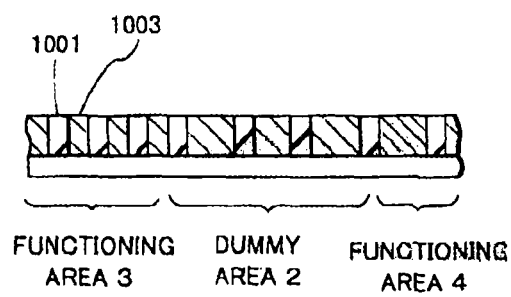
Figure 10D:
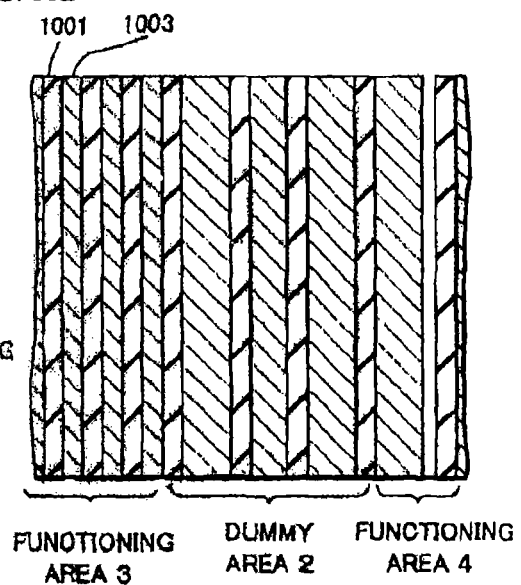
Figure 10E:
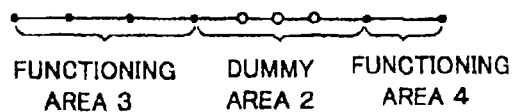
Figure 11A:
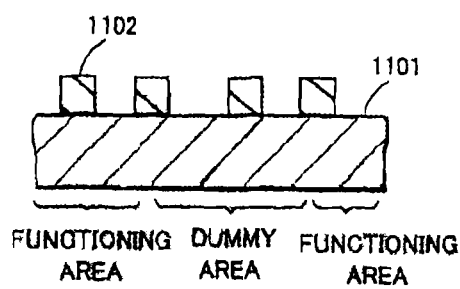
FIGS. 11A-11F are diagrams which explain a pattern in which short circuits do not occur easily even when unnecessary wirings are generated due to side wall processing.
Figure 11B:
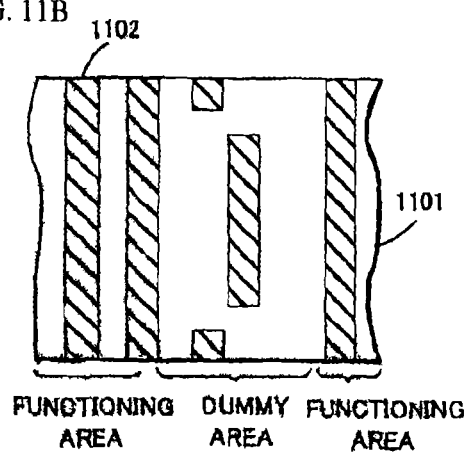
Figure 11C:
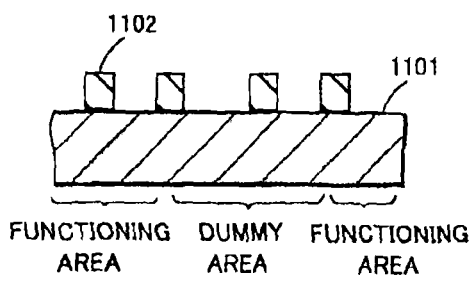
Figure 11D:
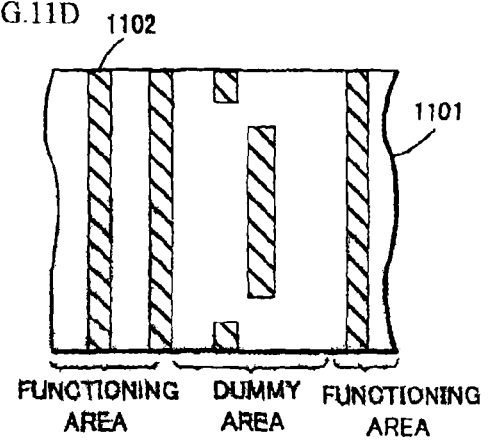
Figure 11E:
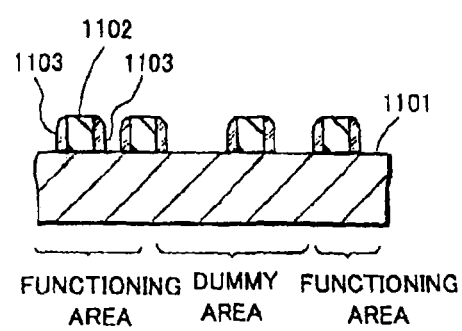
Figure 11F:
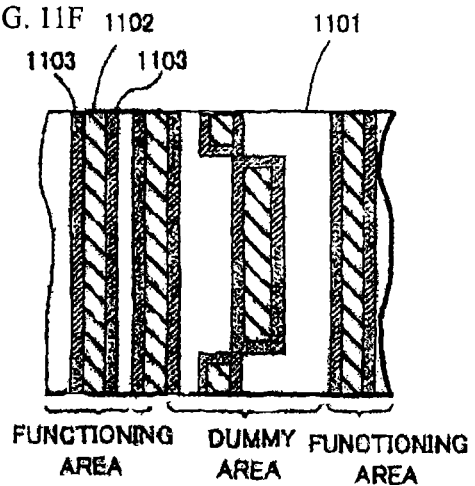

FIGS. 10(A) and (B) exemplify a resolution method for also arranging within the dummy area 2 a space which extends parallel up and down to the space arranged in the functioning areas 3 and 4. Even in this case, due to the constraints due to the side wall processing, the second sacrificial layer 1002 for arranging an even number of spaces is arranged above the insulation layer 1001 within the dummy area 2. Then, etching is performed using the second sacrificial layer 1002 as a mask, the second sacrificial layer 1001 is selectively removed and a conducting material 1003 is filled using a damascene process and a wiring is formed. The graph pattern shown in FIG. 10(E) is a graph pattern created for the pattern shown in FIG. 10(D). All of the white nodes are edges connected to a node and the number of edges connected to a black node is at most one.

Generalizing the case of FIG. 10(E), when a second sacrificial layer formed at or beside a side wall of a first sacrificial layer formed in a functioning area, and a second sacrificial layer formed at or beside a side wall of a first sacrificial layer formed in a dummy area, are formed, it is sufficient that they are formed so that they become separated from each other. When the maximum width of a second sacrificial layer is d, it is sufficient if the distance between the first sacrificial layer formed in a functioning area and a first sacrificial layer formed in a dummy area is twice larger than d.

FIG. 11 and FIG. 12 are diagrams which explain a different pattern formation in a dummy area when an insulation layer is the layer to be processed. As is shown in FIGS. 11(A) and (B), a first sacrificial layer 1102 is formed above an insulation layer 1101. While in the cross sectional diagram in FIG. 11(A) one first sacrificial layer 1102 appears to be arranged in the dummy area, according to the upper surface diagram shown in FIG. 11(B), a first sacrificial layer is arranged in a zig zag shape in the dummy area. That is, the shape of a first sacrificial layer in the dummy area is a shape which consists of a plurality of connected elements. Then, as is shown in FIGS. 11(C) and (D), slimming is performed on the first sacrificial layer 1102. Then, as is shown in FIGS. 11(E) and (F), a second sacrificial layer 1103 is formed on the side wall of the first sacrificial layer 1102. Furthermore, as is shown in FIG. 11(F), arrangement and slimming of the first sacrificial layer is performed so that the second sacrificial layer which are formed on the side walls of the upper and lower first sacrificial layers are connected in the dummy area.

Figure 12A:
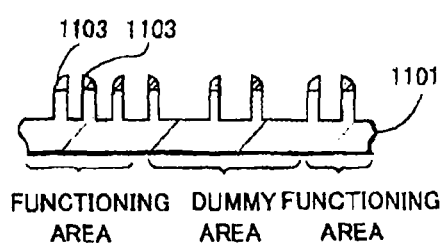
FIGS. 12A-12E are diagrams which explain a pattern in which short circuits do not occur easily even when unnecessary wirings are generated due to side wall processing.
Figure 12B:
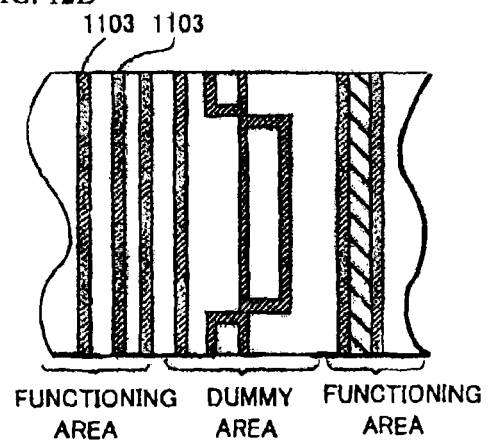
Figure 12C:
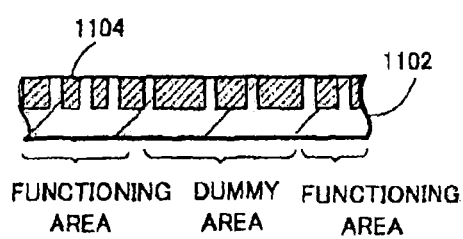
Figure 12D:
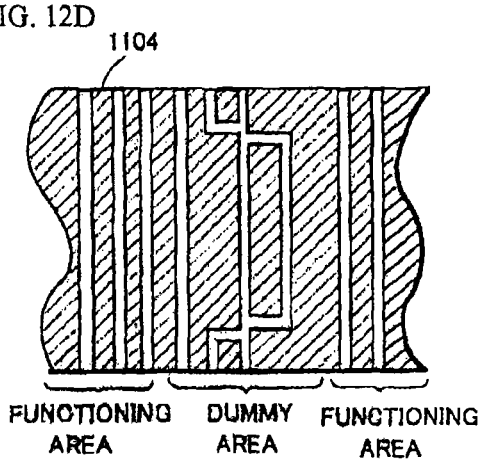
Figure 12E:
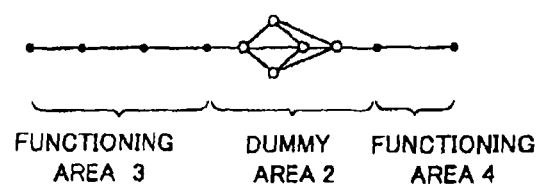

Then, the first sacrificial layer is selectively removed and etching is performed by etching the insulation layer 1101 to a certain depth using the second sacrificial layer as a mask and the structure shown in FIGS. 12(A) and (B) is obtained. That is, a torus shape having a plurality of holes appears in the dummy area. The second sacrificial layer is selectively removed, a conductive material is filled by a damascene processing and the structure shown in FIGS. 12(C) and (D) is obtained. The graph shown in FIG. 12(E) is a graph created for this structure. All of the white nodes are edges connected to a node and the number of edges connected to a black node is at most one.

By arranging a torus shape in a dummy area, even if a force is applied from the side of the torus shape, it is difficult to break up the shape and it becomes possible to prevent the generation of defects due to a break up of a pattern in the dummy area.

Figure 13A:
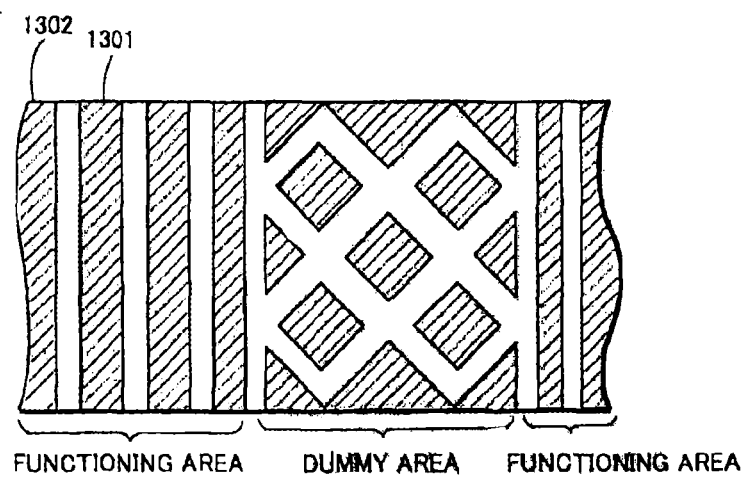
FIGS. 13A-13B are diagrams which explain a pattern in which short circuits do not occur easily even when unnecessary wirings are generated due to side wall processing.
Figure 13B:
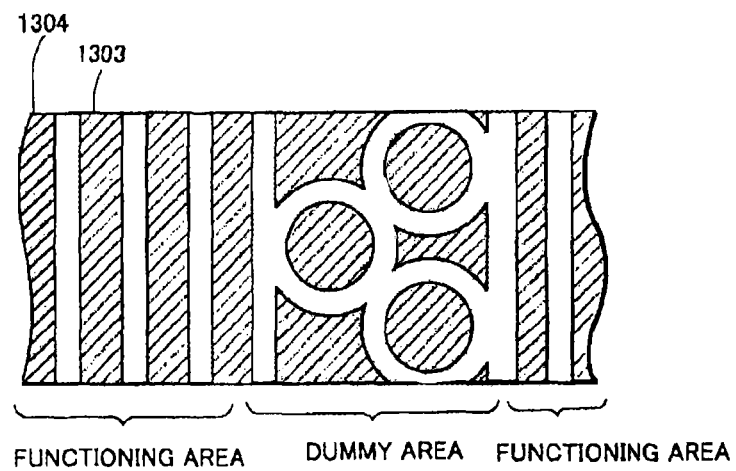

FIGS. 13(A) and (B) show other examples of a pattern created in a dummy area. FIGS. 13(A) and (B) show, other than a torus, shape pattern which are difficult to break up. FIG. 13(A) shows a pattern arranged in a polygonal shape such as a parallelogram or a rhombus shape. In addition, in FIG. 13(B) a pattern based on a circular shape is created in the dummy area. When a graph is made for any of the patterns, all of the white nodes are edges connected to a node and the number of edges connected to a black node is at most one, and the fact that this is a pattern in which short circuits are not generated easily is detected.

Furthermore, in the creation of a layout of a semiconductor device, first its hardware is described with a level of abstraction called an RTL (Register Transfer Level) using a hardware description language for example, based on the specification data of a semiconductor integrated circuit. Next, this description is logically synthesized using a logical synthesis tool and as a result, is developed to a level of abstraction called a gate level. That is, as a logical synthesis result it is possible to obtain data of a logic circuit diagram. Then, it is also possible to produce a net list from the data of this logic circuit diagram.

Next, a plurality of elements are arranged on an integrated circuit based on the data of this logic circuit diagram and by deciding the wiring pathways between this plurality of elements layout data is created for creating a mask. That is, the arrangement of wirings and a functioning area is decided. Then, a distribution of a spatial frequency of a pattern from this layout data is demanded.

That is, in a device for creating a layout of a semiconductor device, the distribution of the spatial frequency of a patter is investigated and a detection is performed to check whether there are places in which changes in the spatial frequency exceed a predetermined change amount. If, it is detected that a change in the spatial frequency exceeds a predetermined change amount, a warning is produced for the occurrence of microloading effects and an error message is displayed etc. In addition, if a place exists in which a spatial frequency is low, a warning is produced for the occurrence of dishing effects, the places in which design of a dummy wiring should be performed is indicated to a designer and design of the dummy wiring is automatically performed etc.

After this, a pattern graph is created, and a check is performed as to whether the conditions have been met for the number of edges connected with a node (black node) corresponding to a functioning area wiring is at most one or not, these edges being connected to a node (white node) corresponding to a dummy area wiring. If is detected that these conditions have not been met, redesign is encouraged or a design of dummy wirings is automatically performed.

In addition, because the pattern of the second sacrificial layer extends in one direction, by calculating a distribution of a pattern spatial frequency, it is possible to detect whether a pattern breaks up easily when a force is applied from the side. When a pattern extends in one direction, the direction in which the pattern extends becomes a spatial frequency value close to 0 and a perpendicular direction to this direction becomes a value larger than 0. Thus, a pattern of a semiconductor process is separated into a pattern of a functioning area and a pattern of a dummy area, a spatial frequency of a dummy area pattern is calculated, and by checking whether a value of a spatial frequency in one direction which is close to 0 is serially connected or not, it becomes possible to detect whether a pattern of the second sacrifice film connected to a dummy area breaks up easily or whether the yield of a semiconductor device is reduced.

Furthermore, as a characteristic of side wall processing a dummy wiring may easily occur in a region in which pattern periodicity of a wiring or insulation space in an integrated circuit changes. Thus, a layout pattern is analyzed and instead of distinguishing between a functioning area and dummy area, a distribution of a pattern spatial frequency is calculated and the detection is performed in a region in which a spatial frequency value exceeds a predetermined change amount. Then, based on this detection, it becomes possible to separate the dummy area and the functioning area. Based on the separation result, the dummy area pattern and the functioning area pattern are separated into different layouts for example. Then, the functioning area pattern which has been separated by this type of procedure may be verified by a design rule check. That is, the functioning area pattern is checked as to whether it conforms to geometric design rules which are designed while paying attention to each type of obtained restriction once the manufacturing process has been verified.

Generally, when a wiring pattern is separated between a functioning area and a dummy area based on the connection relationship of a wiring, a large amount of calculation is required which makes the wiring becomes very complex. However, calculation of the amount of change in spatial frequency may require a calculation amount unrelated to the complexity of the wiring. As a result, it is possible to perform separation of a functioning area and a dummy area in a short period of time and because a design rule check is not performed on the dummy area it is possible to remove the occurrence of simulated errors caused by dummy area wirings which has been indicated as a conventional problem. As a result, it is also possible to complete the design of a semiconductor device in a short period of time.

Second Embodiment

As an embodiment of the present invention, a nonvolatile semiconductor memory device which uses a NAND flash memory as a semiconductor device of one embodiment of the present invention is described below.

Figure 14:
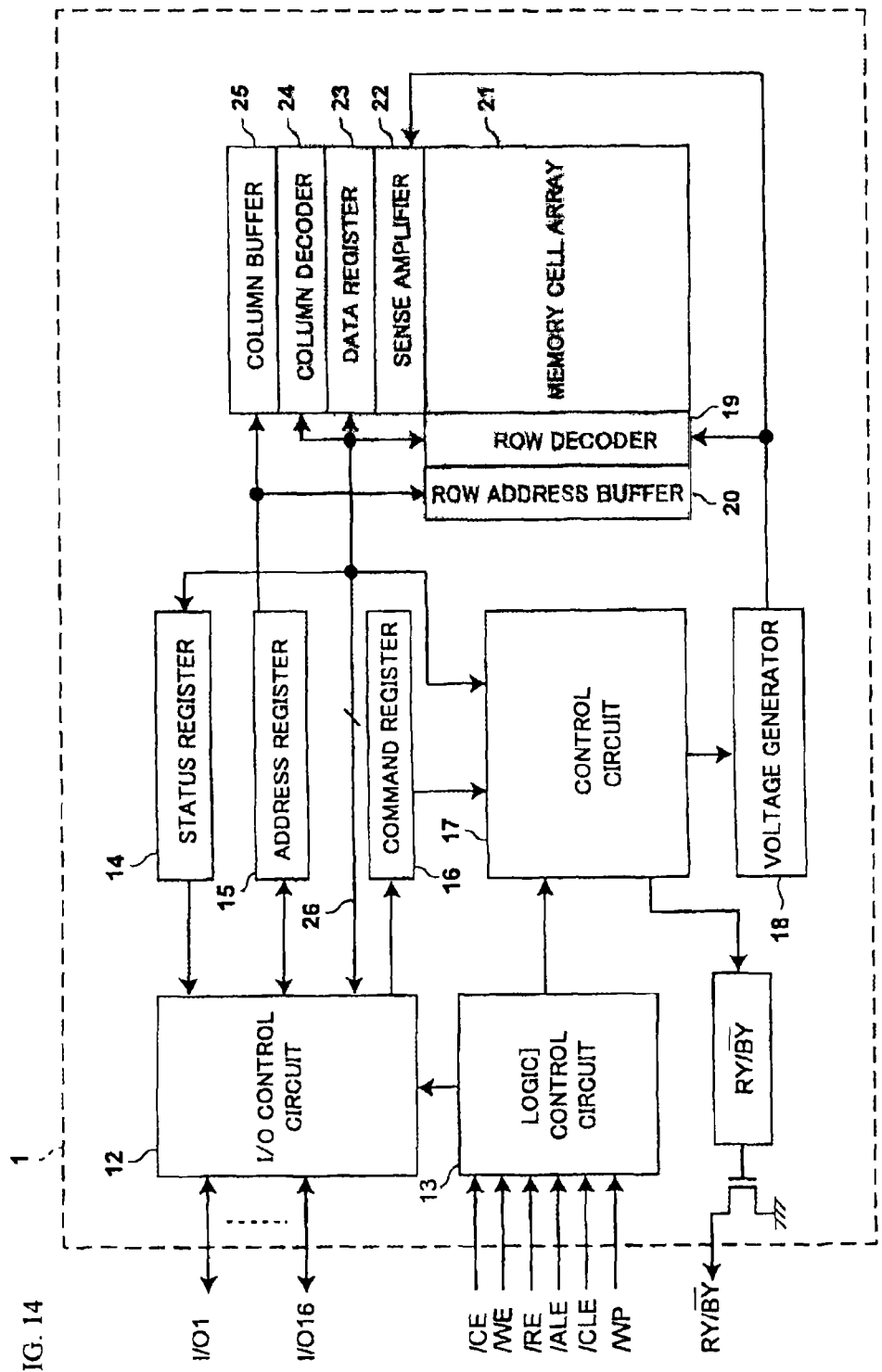
FIG. 14 is a functioning block structure diagram of a nonvolatile semiconductor memory device related to one embodiment of the present invention.

FIG. 14 shows a block diagram of a nonvolatile semiconductor memory device related to an embodiment of the present invention. The nonvolatile semiconductor memory device 1 shown in FIG. 14 is arranged with an I/O control circuit 12, a logic control circuit 13, a status register 14, an address register 15, a command register 16, a control circuit 17, a voltage generation circuit 18, a row decoder 19, a row address buffer 20, a memory cell array 21, a sense amplifier 22, a data register 22, a column decoder 24 and a column buffer 25.

The I/O controller circuit 12 sends and receives data between external input/output terminals I/O 1 to I/O 16 and the data register 23 when reading data or when programming data. In addition, the I/O controller circuit 12 outputs address data which is input from the external input/output terminals I/O 1 to I/O 16 to the address register 15 when reading data or when programming data. Also, the I/O controller circuit 12 outputs commands supplied from the external input/output terminals I/O 1 to I/O 16 to the command register 16. In addition, the I/O controller circuit 12 outputs status data (data for informing an external device on the various states within the chip) which is input from the status register 14 to an external device via the external input/output terminals I/O 1 to I/O 16. While in FIG. 14 the external input/output terminals are expressed as I/O 1 to I/O 16 so that the number of external input/output terminals is 16, an arbitrary number of external input/output terminals may be used.

The logic control circuit 13 outputs external control signals such as a chip enable signal CE, a write enable signal WE, a read enable signal RE, an address latch enable signal ALE, a command latch enable signal CLE and a write protect signal WP which are externally input to the control circuit 17.

The status register 14 is a register for informing an external device on the various statuses of the chip and includes a ready/busy register which holds data which shows whether the chip is in a ready or busy status, a programming status register which holds data which shows a programming pass or fail, a programming error register which holds data which shows the existence of a program error status (program verify pass/fail) and an overwrite status register which holds data which shows the existence of an overwrite status (overwrite verify pass or fail).

The address register 15 decodes address data input from the I/O control circuit 12, outputs a row address to the row address buffer 20 and outputs a column address to the column address buffer 25.

The command register 16 outputs a command which is input from the I/O control circuit 12 to the control circuit 17.

The control circuit 17 outputs a command which is input from the command register 16 to the voltage generation circuit 18. In addition, the control circuit 17 performs a data program, data read and data erase control sequence of controls based on an external control signal input from the logic control circuit 13 and a command input from the command register 16 according to an operation mode.

The voltage generation circuit 18 is a circuit for generating various Vpp voltages (program voltage Vpgm, verify voltage Vr, program pass voltage Vpass, read voltage Vread, etc.). This voltage generation circuit 18 is controlled by the control circuit 17.

The row decoder 19 includes a word line drive circuit which selects a word line of the memory cell array 21 and drives a word line based on a row address (page address) stored in the row address buffer 20.

The row address buffer 20 stores a row address input from the address register 15.

The memory cell array 21 comprises a plurality of NAND cell units. Each NAND cell unit is comprised by a memory string in which a plurality of electrically reprogrammable nonvolatile memory cells are serially connected, and a memory block which includes a plurality of NAND cell units, each NAND cell unit being connected to a selection transistor at each end. The memory cell array 21 is generally comprised by a plurality of memory blocks. A word line connects the control gates of nonvolatile memory cells of every NAND cell unit in a memory block. The selection gates of selection transistors are connected to a section gate line which is arranged parallel to word lines. A group of NAND cell units which share a word line comprise a memory block which is a unit of data erasure. A plurality of these memory cell blocks is included within the memory cell array 21.

When reading data the sense amplifier 22 reads data which is stored in a nonvolatile memory cell selected by the row decoder 19 and the column decoder 24 and outputs to the data register 23.

The data register 23 is connected with the I/O control circuit 12 via the I/O bus 26. When reading data the data register 23 outputs data read via the sense amplifier circuit 22 to the input/output terminals I/O 1 to I/O 16 via the I/O control circuit 12. In addition, when programming data the data register 23 outputs via the input/output terminals I/O 1 to I/O 16 and the I/O control circuit 12 data to be programmed, which is loaded from an external controller 2, to the sense amplifier circuit 22. Furthermore, the data register 23 may include a trimming data register (not shown in the diagram) for storing trimming data (voltage level setting data for operation voltage adjustment or clock data for clock adjustment within a memory chip) which is used when demanding/requesting a parameter which controls an operation of the memory cell array 21, and a defective block address register (not shown in the diagram) which stores address data of a defective block detected as result of the above stated test operation.

The column decoder 24 selects a bit line of the memory cell array 21 based on a column address stored in the column buffer 25. The column buffer 25 stores a column address which is input from the address register 15. The I/O bus 26 is a bus which connects the I/O control circuit 12 with the data register 23.

Figure 15A:
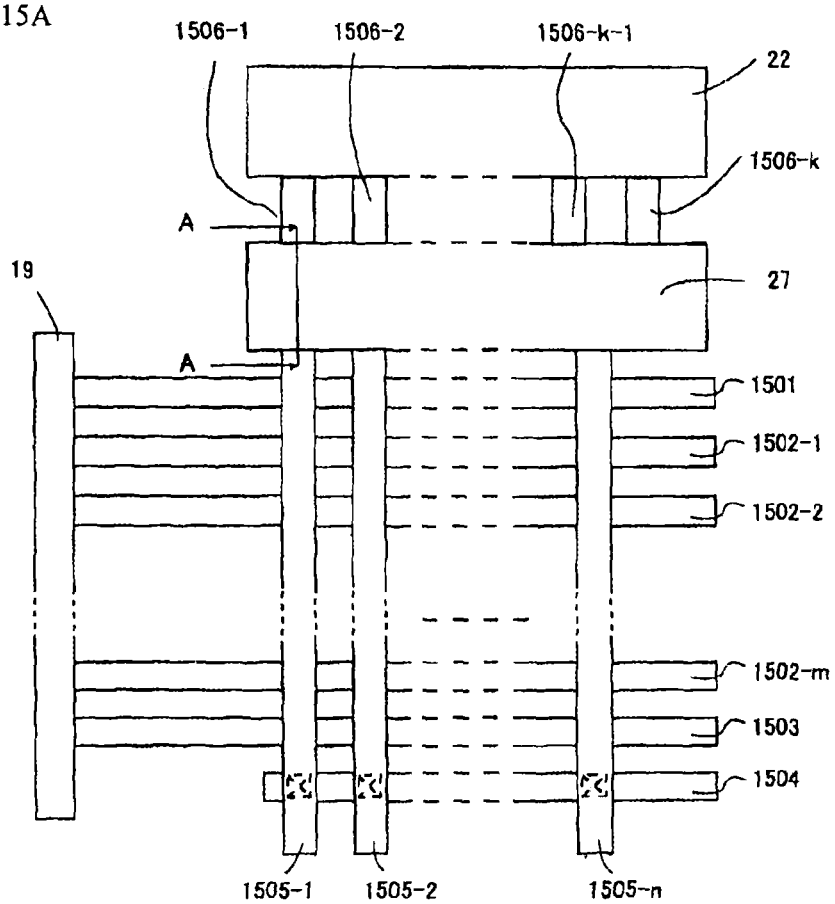
FIGS. 15A-15C are diagrams which exemplary explain a stacked layer structure of a memory block of a memory cell array in a nonvolatile semiconductor memory device related to one embodiment of the present invention.

FIG. 15 is a diagram which exemplarily explains a layered structure of a memory block in the memory cell array 21. An insulation layer such as an oxide layer is formed on the surface of a substrate and wirings which form the select lines 1501,1503 and word lines 1502-1, 1502-2, . . . , 1502-$m$, formed above the substrate, are arranged above this as shown in FIG. 15(A). These select gate lines and word lines are connected to the row decoder 19. Furthermore, an active region which extends in a direction perpendicular to the select gate lines and word lines is formed on the substrate using, for example, an STI (Shallow Trench Isolation) structure. The select gate lines are also functioning as gate electrodes of the selection transistors which are formed in this active region. In addition, if a nonvolatile memory cell is a memory transistor, a charge storage layer is formed between the active region and a word line.

A common source line 1504 is arranged on a layer above the layer in which a select gate line and a word line are arranged via an interlayer insulation material. Then, again via an interlayer insulation material, the bit lines 1505-1, 1505-2, and 1505-$n$ are arranged. Lines 1506-1,1506-2, and 1506-$k$ which connect the sense amplifier 22 with a selector circuit 27 are arranged on the same layer as the layer in which the bit lines is arranged. The selector circuit 27 is a circuit for selecting a bit lit which is connected to a sense amplifier when the number of sense amplifiers of the sense amplifier circuit and the number of bit lines are different (generally the number of sense amplifiers is not larger than the number of bit lines).

Figure 15B:
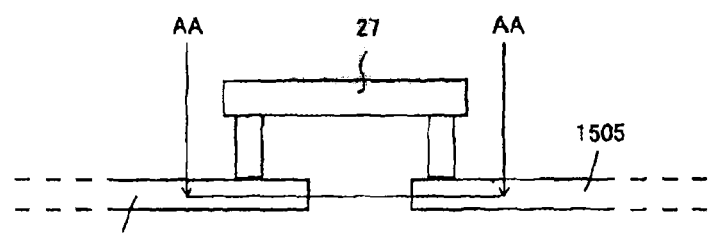

FIG. 15(B) shows a cross sectional view of a cross section along the line A-A in FIG. 15(A). The wiring 1506 is connected with the selector circuit 27 via a contact, and the bit line 1505 is also connected with the selector circuit 27 via a different contact.

Figure 15C:
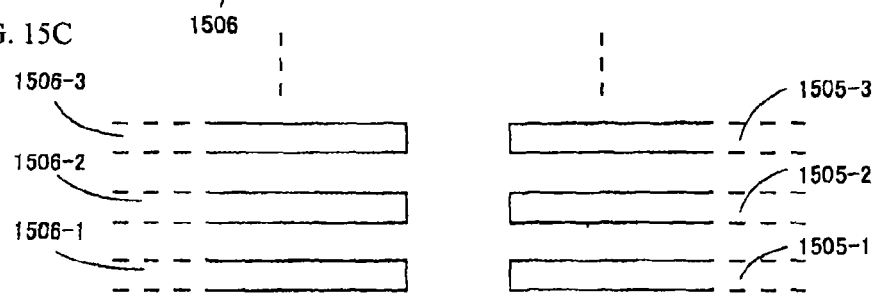

FIG. 15(C) shows a cross sectional view of a cross section along the line AA-AA in FIG. 15(B). In FIG. 15(C) the lines 1506-1, 1506-2, and 1506-3 which connect the sense amplifier circuit 22 and the selector circuit 27 are lined on the left side and the bit lines 1505-1,1505-2, and 1505-3 are lines on the right side.

FIG. 16 is a diagram which shows the structure shown in FIG. 15(C) in more detail. That is, FIG. 16 shows wirings in a functioning area of a layer in which the cross section AA-AA in FIG. 15(B) is drawn. A large number of bit lines of the memory cell array 21 are lined in the column labeled 1601 and a large number of wirings which connect the sense amplifier circuit 22 with the selector circuit 27 are lined in the column labeled 1602. The part labeled 1603 is a region between the column labeled 1601 and the column labeled 1602 and the selector circuit 27 is arranged on a layer above this region.

A part in which bit lines are lined consecutively similar to the part labeled 1604 and a part in which bit lines are not lined similar to the part 1605, are lined alternately in the column labeled 1601. The part labeled 1605 is a region in which nonvolatile memory cells are not arranged and is called a shunt region of the memory cell array 21.

In addition, a part exists in which bit lines are lined consecutively similar to the part labeled 1606 and another part exists in which bit lines are not lined similar to the part 1607 and 1608, in the column labeled 1602. The part labeled 1608 corresponds to the shunt region of the memory cell array 21. Because there are no bit lines in the shunt region of the memory cell array 21, it is not necessary to arranged sense amplifiers in lines and there are no wirings. In addition, the part labeled 1606 corresponds to one group of sense amplifiers which are arranged in the sense amplifier circuit 22. Also, in the case where one sense amplifier is responsible for amplification of voltages of a plurality of bit lines, a bit line and a sense amplifier no longer correspond as one pair. As a result, a region where there are no wirings as in the part labeled 1607, periodically appears. As is shown in FIG. 16, generally, the width of the region labeled 1607 becomes smaller than the width of the region labeled 1608 which is a region which corresponds to the shunt region of the memory cell array 21. This is because a region exists which corresponds to the region labeled 1607, on both ends of the region labeled 1608.

In addition, when the pitch of bit lines arranged in the column labeled 1601 is pbl, that is, when the width of a bit line and the width of a space between bit lines is pbl as shown in FIG. 16, and when the pitch of bit lines arranged in the column labeled 1602 is pbl$i$, generally, the relationship 2×pbl>=pbli>=pbl holds. This is because it is difficult to significantly change the width of the second sacrificial layer by side wall processing.

It is possible to create a graph of a position in a substrate and a pattern density as is shown in FIG. 3 for the wiring shown in FIG. 16. A part with a high pattern density 1604 corresponding to pbl and a part with a low pattern density 1605 which corresponds to the shunt region in the memory cell array 21, appears alternately in the column labeled 1601. Therefore, if a dummy wiring is not created in the shunt region of the memory cell array 21, a difference occurs in the pattern density.

In addition, a part with a high pattern density 1606 corresponding to pbli and a part with a low pattern density 1605 which corresponds to the regions labeled 1606 and 1607, appear alternately in the column labeled 1602. Therefore, if a dummy wiring is not created in the regions labeled 1607 and 1608, a difference occurs in pattern density, spatial frequency, etc.

Figure 17:
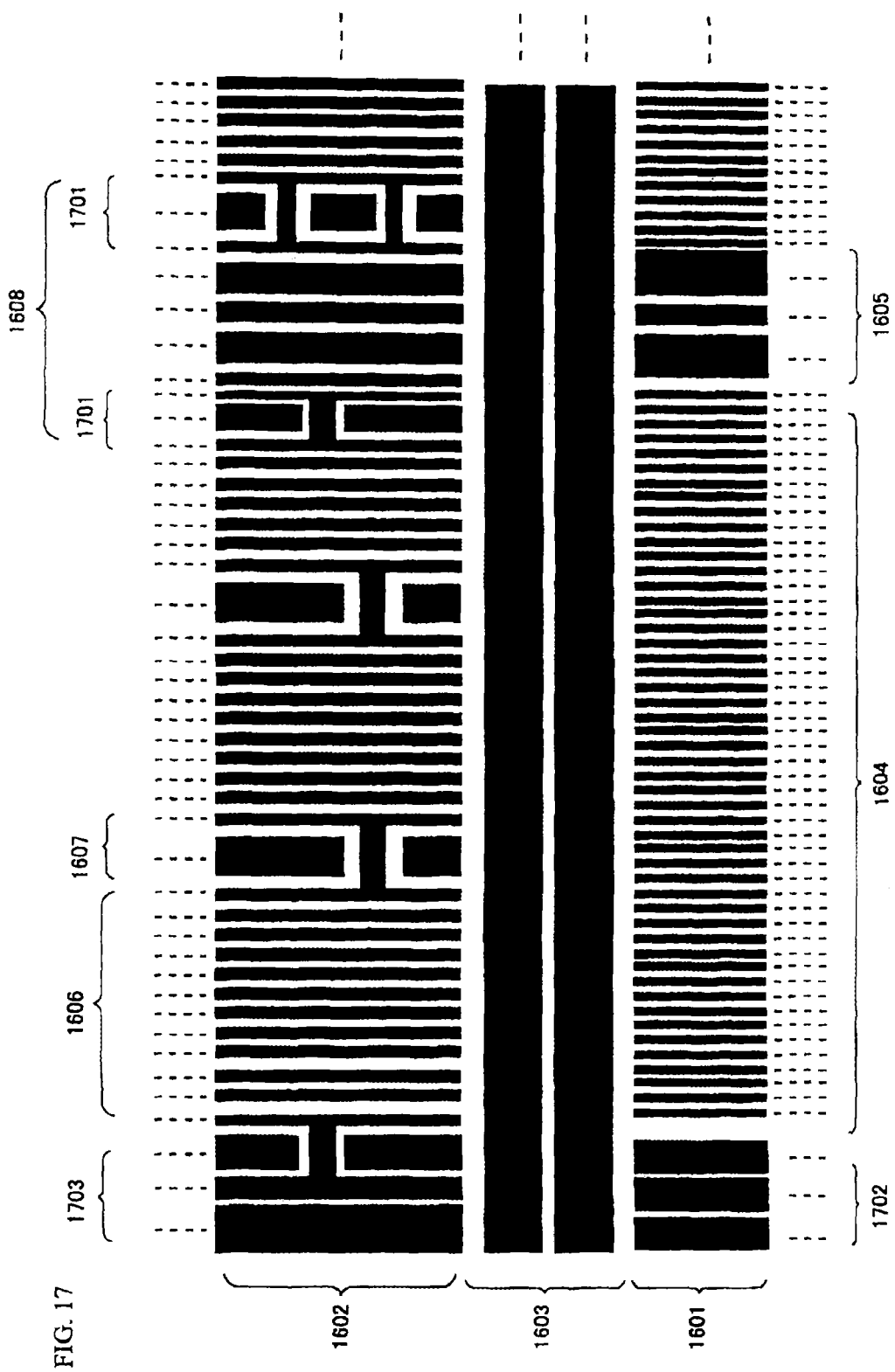
FIG. 17 is a diagram which shows the addition of dummy wirings to a functioning wiring of a memory cell array and sense amplifier related to a nonvolatile semiconductor memory device related to one embodiment of the present invention.

Therefore, as is shown in FIG. 17, in order to reduce this difference in pattern density, in spatial frequency, etc., the regions labeled 1605, 1606, 1607 and 1608 are treated as dummy areas and a dummy wiring is arranged. As stated above, because a region 1701 which corresponds to the region labeled 1607 exists on both ends of the region labeled 1608, a dummy wiring of the region labeled 1607 is formed. In addition, if a pattern does not exist in the region labeled 1703, because pattern differs significantly, a dummy pattern is formed.

By creating a dummy pattern in this way it is possible to reduce changes in pattern density and prevent an occurrence of the effects of microloading and dishing. In addition, by using side wall processing it is possible to form a pattern which exceeds resolution limits and realize a small scale semiconductor device. When side wall processing is used, unnecessary wiring were conventionally created and short circuits easily occurred via these unnecessary wirings, however, by applying an embodiment of the present invention it is possible to prevent the occurrence of these short circuits.

According to an embodiment of the present invention it is possible to prevent the occurrence of shorts circuits due to unnecessary wirings formed by side wall processing and also prevent the occurrence of microloading and dishing effects. It is also possible to realize an improvement in yield while achieving a small scale semiconductor device.

What is claimed is:

1. A semiconductor device comprising:
a semiconductor substrate extending in a first direction, a second direction, and a third direction, the first to third directions crossing one another, the semiconductor substrate having a front surface at a first side in the third direction and a rear surface at a second side in the third direction, the first surface having patterns having different heights in the third direction, the rear surface having a planer shape extending in the first direction and the second direction;
a first conductive line extending in the first direction;
a second conductive line formed on the front surface of the semiconductor substrate and extending in the first direction, the first conductive line and the second conductive line being provided in an imaginary plane crossing the third direction;
a dummy area formed on the front surface of the semiconductor substrate between the first conductive line and the second conductive line, and being electrically isolated from the first conductive line and the second conductive line,
the dummy area including first to seventh conductive patterns physically divided in the imaginary plane,
the first, second, and third conductive patterns being arranged in this order along a fourth direction which is neither parallel nor orthogonal to the first direction,
the fourth, second, and fifth conductive patterns being arranged in this order along a fifth direction which is different from the fourth direction the first direction,
the sixth, second, and fourth seventh conductive patterns being arranged in this order along a sixth direction which is different from the fourth direction and the fifth direction.

2. The semiconductor device according to claim 1, wherein at least one of the fourth to sixth direction is the same as one of the first and second directions.

3. The semiconductor device according to claim 2, wherein the sixth direction is the same as the second direction.

4. The semiconductor device according to claim 3, wherein the fourth direction and the fifth direction cross with each other.

5. The semiconductor device according to claim 1, wherein
shapes of the first to fifth conductive patterns are geometrically similar to one another, and
shapes of the sixth and seventh conductive patterns are geometrically symmetrical with each other.

6. The semiconductor device according to claim 1, wherein the first conductive line and the conductive second line are functioning lines.

7. The semiconductor device according to claim 1, wherein the first to seventh conductive patterns have shapes based on a sidewall transfer processing.

8. The semiconductor device according to claim 1, wherein the first to seventh conductive patterns include a detailed pattern exceeding resolution limits of optical lithography.

9. The semiconductor device according to claim 1, wherein the semiconductor device is a NAND flash memory device.

10. The semiconductor device according to claim 1, further comprising:
a first functioning area extending in the first line, the first conductive line being provided in plurality in the first functioning area;

a pattern density of the plurality of first conductive lines in the first functioning area being larger than a pattern density of the first to seventh conductive patterns.

11. The semiconductor device according to claim 10, further comprising:
a second functioning area extending in the first line, the second conductive line being provided in plurality in the second functioning area;
a pattern density of the plurality of second conductive lines in the first functioning area being larger than the pattern density of the first to seventh conductive patterns.

12. The semiconductor device according to claim 11, wherein the pattern density of the plurality of first conductive lines in the first functioning area is the same as the pattern density of the plurality of second conductive lines in the second functioning area.

13. The semiconductor device according to claim 11, wherein a spatial density in the first functioning area is the same as a spatial density in the second functioning area.

14. The semiconductor device according to claim 11, further comprising:
a connecting portion electrically connecting one of the first conductive lines adjacent to the dummy area and one of the second conductive lines adjacent to the dummy area,
wherein at least part of the first to seventh conductive patterns are arranged adjacent to the connecting portion.

15. The semiconductor device according to claim 1, wherein the dummy area includes a plurality of insulating lines.

16. The semiconductor device according to claim 15, wherein
the insulating lines includes a first insulating line extending in the fifth direction, and a second insulating line extending in the fifth direction,
the first insulating line passes by one side of each of the fourth, second, and fifth conductive patterns in the fourth line, and
the first insulating line passes by the other side of each of the fourth, second, and fifth conductive patterns in the fourth line.

17. The semiconductor device according to claim 15, wherein the insulating lines include a first insulating line extending in the fifth direction to divide the fourth conductive pattern and the seventh conductive pattern and to divide the second conductive pattern and the third conductive pattern, and a second insulating line extending in the fifth direction to divide the second conductive pattern and the first conductive pattern and to divide the fifth conductive pattern and the sixth conductive pattern.

18. A semiconductor device comprising:
a semiconductor substrate extending in a first direction, a second direction, and a third direction, the first to third directions crossing one another, the semiconductor substrate having a front surface at a first side in the third direction and a rear surface at a second side in the third direction, the first surface having patterns having different heights in the third direction, the rear surface having a planer shape extending in the first direction and the second direction;
a first conductive line formed on the front surface of the semiconductor substrate and extending in the first direction;
a second conductive line formed on the front surface of the semiconductor substrate and extending in the first direction, the first conductive line and the second conductive line being provided in an imaginary plane crossing the third direction;
a dummy area being formed on the front surface of the semiconductor substrate between the first conductive line and the second conductive line, and being electrically isolated from the first conductive line and the second conductive line,
the dummy area including first and second conductive patterns physically divided in the imaginary plane,
the first and second conductive patterns being arranged along a fourth direction which is neither parallel nor orthogonal to the first direction,
the first conductive pattern being closer to the second conductive line as compared with the second conductive pattern,
the second conductive pattern being closer to the first conductive line as compared with the first conductive pattern.

* * * * *